(12) United States Patent
Motoki et al.

(10) Patent No.: US 7,357,837 B2
(45) Date of Patent: Apr. 15, 2008

(54) GAN SINGLE CRYSTAL SUBSTRATE AND METHOD OF MAKING THE SAME

(75) Inventors: Kensaku Motoki, Itami (JP); Takuji Okahisa, Itami (JP); Naoki Matsumoto, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 43 days.

(21) Appl. No.: 10/691,540

(22) Filed: Oct. 24, 2003

(65) Prior Publication Data

US 2004/0089222 A1 May 13, 2004

Related U.S. Application Data

(60) Division of application No. 09/560,818, filed on Apr. 28, 2000, now Pat. No. 6,693,021, which is a continuation-in-part of application No. PCT/JP98/04908, filed on Oct. 29, 1998.

(30) Foreign Application Priority Data

| Oct. 30, 1997 | (JP) | 9-298300 |
| Jan. 20, 1998 | (JP) | 10-009008 |
| Apr. 14, 1998 | (JP) | 10-102546 |

(51) Int. Cl.
*C30B 23/04* (2006.01)

(52) U.S. Cl. ............... 117/84; 117/88; 117/90; 117/91; 117/94; 117/95; 117/97; 117/99; 117/101; 117/106; 117/902; 117/952

(58) Field of Classification Search .......... 117/84, 117/88, 90, 91, 94, 95, 97, 99, 101, 106, 902, 117/952

See application file for complete search history.

(56) References Cited

U.S. PATENT DOCUMENTS

| 4,727,047 | A |   | 2/1988  | Bozler et al. |
| 5,182,233 | A | * | 1/1993  | Inoue ........................ 83/35 |
| 5,679,152 | A | * | 10/1997 | Tischler et al. ............ 117/97 |
| 5,770,887 | A | * | 6/1998  | Tadatomo et al. ......... 257/613 |
| 5,828,088 | A | * | 10/1998 | Mauk ........................ 257/98 |

(Continued)

FOREIGN PATENT DOCUMENTS

| EP | 0 801 156 | 10/1997 |
| EP | 0 810 674 | 12/1997 |

(Continued)

OTHER PUBLICATIONS

IBM, Abstract of "Method of Producing Gallium Nitride Boules for Processing into Substrates", IBM Technical Disclosure Bullet May 1997, vol. 40, Issue 5, May 1, 1997.*

(Continued)

*Primary Examiner*—Robert Kunemund
*Assistant Examiner*—Matthew J. Song
(74) *Attorney, Agent, or Firm*—Smith, Gambrell & Russell, LLP.

(57) ABSTRACT

The method of making a GaN single crystal substrate comprises a mask layer forming step of forming on a GaAs substrate 2 a mask layer 8 having a plurality of opening windows 10 disposed separate from each other; and an epitaxial layer growing step of growing on the mask layer 8 an epitaxial layer 12 made of GaN.

8 Claims, 21 Drawing Sheets

U.S. PATENT DOCUMENTS

| | | | |
|---|---|---|---|
| 5,834,325 | A | 11/1998 | Motoki et al. |
| 5,838,029 | A * | 11/1998 | Shakuda .................... 257/190 |
| 5,843,227 | A | 12/1998 | Kimura et al. |
| 5,846,609 | A | 12/1998 | Shiralagi |
| 5,962,875 | A | 10/1999 | Motoki et al. |
| 5,962,915 | A | 10/1999 | Young et al. |
| 5,970,314 | A | 10/1999 | Okahisa et al. |
| 6,087,681 | A | 7/2000 | Shakuda |
| 6,096,130 | A | 8/2000 | Kimura et al. |
| 6,156,581 | A | 12/2000 | Vaudo et al. |
| 6,225,650 | B1 | 5/2001 | Tadatomo et al. |
| 6,270,569 | B1 | 8/2001 | Shibata et al. |

FOREIGN PATENT DOCUMENTS

| | | |
|---|---|---|
| JP | 51-50899 | 5/1976 |
| JP | 7-273048 | 10/1995 |
| JP | 07-273048 | 10/1995 |
| JP | 8-116090 | 5/1996 |
| JP | 09-194299 | 7/1997 |
| JP | 09-255496 | 9/1997 |
| JP | 9-255496 | 9/1997 |
| JP | 10-265297 | 10/1998 |
| JP | 10-312971 | 11/1998 |
| JP | 10-321529 | 12/1998 |
| JP | 10-326751 | 12/1998 |
| JP | 11-135770 | 5/1999 |
| WO | WO96/41906 | 12/1996 |
| WO | 97/11518 | 3/1997 |

OTHER PUBLICATIONS

Zheleva et al. "Dislocation density reduction via lateral epitaxy in selectively grown GaN structures", Appl. Phys. Lett. 71 (17), Oct. 2, 1997, pp. 2472-2474.*

Nam et al. "Lateral epitaxy of low defect density GaN layers via organometallic vapor phase epitaxy", Appl. Phys. Lett. 71 (18), Nov. 1997, pp. 2638-2640.*

Nam et al. "Growth of GaN and Al0.2Ga0.8N on Patterned Substrates via Organometallic Vapor Phase Epitaxy"Jpn. j. Appl. Phys. vol. 36 (May 1, 1997), Pt. 2, No. 5A, p. L532-L535.*

Office Action dated Sep. 19, 2006 in U.S. Appl. No. 10/691,569.

Masaki Nagahara, et al., "Selective Growth of Cubic GaN in Small Areas on Patterned GaAs (100) Substrates by Metalorganic Vapor Phase Epitaxy", Japanese Journal of Applied Physics, Publication Office Japanese Journal of Applied Physics, vol. 33, No. 1B, Part 1, (1994), pp. 694-697, XP000596419.

X. Li, et al., "Characteristics of GaN Stripes Grown by Selective-Area Metalorganic Chemical Vapor Deposition", Journal of Electronic Materials, vol. 26, No. 3, (1996), pp. 306-310, XP009004611.

Database Inspec 'Online! Institute of Electrical Engineers, Stevenage, GB; Matsushima H. et al., "Sub-micron fine structure of GaN by metalorganic vapor phase epitaqxy (MOVPE) selective area growth (SAG) and buried structure by epitaxial lateral overgrowth (ELO)", Database accession No. 6037425 XP-002268861, 1998.

Database Inspec 'Online! Institute of Electrical Engineers, Stevenage, GB; Shibata T et al., "Hybrid vapor-phase epitaxy growth of high-quality GaN bulk single crystal by epitaxial lateral overgrowth", Database accession No. 6037423 XP-002268862, 1998.

Database Inspec 'Online! Institute of Electrical Engineers, Stevenage, GB; Sasaoka C et al., "High-quality InGaN MQW on low-dislocation-density GaN substrate grown by hydride vapor-phase epitaxy", Database accession No. 6037422 XP-002268863, 1998.

Chinese Office Action mailed Jun. 20, 2003.

U. Akira et al. "Thick GaN Epitaxial Growth With Low Dislocation Density by Hydride Vapor Phase Epitaxy" Japanese Journal of Applied Physics, Jul. 15, 1997, Part. 2, vol. 36, No. 7B, pp. L899-L902.

S. Akira et al. "Defect Structure in Selectively Grown GaN Films With Low Threading Dislocation Density" Applied Physics Letters, Oct. 20, 1997, vol. 71, No. 16, pp. 2259-2261.

H. Shima et al. "Selective Growth of GaN on Submicron Pattern by MOVPE (in Japanese)" Technical Report of IEICE, vol. 97, No. 61, May 23, 1997 (Tokyo), pp. 41-46.

T. Shibata et al. "Preparation of High-Quality GaN Bulk Single Crystal by Selective HVPE Growth (in Japanese)", Technical Report of IEICE, vol. 97, No. 61, May 23, 1997 (Tokyo), pp. 35-40.

K. Shota et al. "Fabrication of GaN Hexagonal Pyramids on Dot-Patterned GaN/Sapphire Substrates Via Selective Metalorganic Vapor Phase Epitaxy" Japanese Journal of Applied Physics, Sep. 15, 1995, Part 2, vol. 34, No. 9B, pp. P1184-L1186.

International Preliminary Examination Report (PCT/IPEA/409) (translated) for J PCT/JP98/04908, 1999.

International Search Report for PCT/JP98/04908, 1999.

Cover page of WO99/23693, 1999.

Forms PCT/IB/304 and PCT/IB/308, 1999.

Korean Office Action mailed Apr. 23, 2003.

Japanese Patent Office Action for corresponding Patent Application No. 2000-519462 (Apr. 18, 2006).

H. Okumura, et al. "Epitaxal growth of cubic and hexagonal GaN on GaAs on GaAs by gas-source molecular epitaxy," Appl. Phys. Lett. 59(9), 1991.08.26, pp. 1058-1060.

Naniwae, et al., "Growth of Single Crystal GaN Substrate Using Hydride Vapor Phase Epitaxy," Journal of Crystal Growth 99, 1990, pp. 381-384.

* cited by examiner

GAN SINGLE CRYSTAL SUBSTRATE AND METHOD OF MAKING THE SAME

RELATED APPLICATIONS

This application is division of application Ser. No. 09/560,818, filed Apr. 28, 2000, now U.S. Pat. No. 6,693,021, issued Feb. 17, 2004, which is a continuation-in-part (CIP) of International Application No. PCT/JP98/04908 having an international filing date of Oct. 29, 1998 and a priority date of Oct. 30, 1997, all of which are incorporated herein by reference in their entirety. The benefit of priority from Japanese Patent Application Nos. 298300 (filed Oct. 30, 1997), 009008 (filed Jan. 20, 1998), and 102546 (filed Apr. 14, 1998) is claimed.

BACKGROUND OF THE INVENTION

1. Field of the Invention

The present invention relates to a substrate, using a nitride type compound semiconductor such as gallium nitride (GaN), for light-emitting devices such as light-emitting diodes and semiconductor lasers, and electronic devices such as field-effect transistors; and a method of making the same.

2. Related Background Art

In light-emitting devices using nitride type compound semiconductors, and the like, stable sapphire substrates have conventionally been used.

Since sapphire has no cleavage surfaces, however, it has been problematic in that a reflecting surface cannot be made by cleavage when a sapphire substrate is employed for a semiconductor laser.

There is also a problem that, when sapphire is employed as a substrate material for a light-emitting device or the like, there occurs a lattice mismatch or difference in coefficient of thermal expansion between the sapphire substrate and an epitaxial layer grown thereon, whereby crystal defects such as dislocation often occur in the epitaxial layer.

As a technique developed in order to overcome such a problem in the case where sapphire is employed as a substrate for a light-emitting device or the like, there is a method of making a semiconductor light-emitting device disclosed in Japanese Patent Application Laid-Open No. HEI 8-116090. This method of making a semiconductor light-emitting device comprises the steps of growing a gallium nitride type compound semiconductor layer on a semiconductor single crystal substrate such as an gallium arsenide (GaAs) substrate; eliminating the semiconductor single crystal substrate (GaAs substrate) thereafter; and using the remaining gallium nitride compound semiconductor layer as a new substrate and epitaxially growing a gallium nitride type compound semiconductor single crystal layer as an active layer thereon, thereby making the semiconductor light-emitting device.

According to the technique of Japanese Patent Application Laid-Open No. HEI 8-116090, the lattice constant and coefficient of thermal expansion of the gallium nitride compound semiconductor layer are very close to those of the gallium nitride compound semiconductor single crystal layer (epitaxial layer) grown thereon, so that lattice defects due to dislocation or the like are harder to occur in the semiconductor single crystal layer (epitaxial layer). Also, since the substrate and the active layer grown thereon are made of the same gallium nitride type compound semiconductor layer, the same kind of crystals align with each other, whereby they can easily be cleaved. Consequently, reflecting mirrors for semiconductor lasers and the like can easily be produced.

SUMMARY OF THE INVENTION

However, the GaN substrate manufactured by the method disclosed in the above-mentioned Japanese Patent Application Laid-Open No. HEI 8-116090 has a very low crystal quality due to lattice mismatches and the like, so that large warpage occurs due to internal stress caused by crystal defects, whereby it has not been in practical use yet. Along with advances in technology, it has been required to further improve characteristics of semiconductor devices using gallium nitride type compound semiconductors, whereby it has become necessary for the inventors to produce a GaN single crystal substrate having a higher quality. To this aim, it is necessary to further reduce crystal defects such as dislocation occurring in the epitaxial layer of the GaN single crystal substrate. If crystal defects are reduced, then a GaN single crystal substrate having a high crystal quality, low internal stress, and substantially no warpage can be obtained.

In view of such circumstances, it is an object of the present invention to provide a GaN single crystal substrate in which crystal defects such as dislocation have been reduced, and a method of making the same.

The method of making a GaN single crystal substrate in accordance with the present invention comprises a mask layer forming step of forming on a GaAs substrate a mask layer having a plurality of opening windows disposed separate from each other; and an epitaxial layer growing step of growing on the mask layer an epitaxial layer made of GaN.

In the method of making a GaN single crystal substrate in accordance with the present invention, a GaN nucleus is formed in each opening window of the mask layer, and this GaN nucleus gradually laterally grows sidewise above the mask layer, i.e., toward the upper side of a mask portion not formed with the opening windows in the mask layer, in a free fashion without any obstacles. Since defects in the GaN nucleus do not expand when the GaN nucleus laterally grows, a GaN single crystal substrate with greatly reduced crystal defects can be formed.

Preferably, the method of making a GaN single crystal substrate in accordance with the present invention further comprises, before the mask layer forming step, a buffer layer forming step of forming a buffer layer on the GaAs substrate, and a lower epitaxial layer growing step of growing on the buffer layer a lower epitaxial layer made of GaN.

In this case, since the lower epitaxial layer made of GaN is positioned below the opening windows of the mask layer, whereas the epitaxial layer made of GaN is formed on the lower epitaxial layer, crystal defects of the epitaxial layer are further reduced. Since crystal defects such as dislocation have a higher density in a part closer to the buffer layer, they can be reduced in the case where the mask layer is thus formed with a distance from the buffer layer after the lower epitaxial layer is once formed, as compared with the case where the lower epitaxial layer is not grown.

Preferably, the method of making a GaN single crystal substrate in accordance with the present invention further comprises, before the epitaxial layer growing step, a buffer layer forming step of forming a buffer layer on the GaAs substrate in the opening windows of the mask layer.

In this case, a single operation of growing the GaN epitaxial layer can form a GaN single crystal substrate having greatly reduced crystal defects, thereby cutting down the cost. In the case where the GaN epitaxial layer is to be grown on the GaAs substrate, epitaxial growth can be attained, even if there are large lattice mismatches, when GaN is grown at a high temperature after a GaN low-temperature buffer layer or AlN buffer layer close to an amorphous layer is grown. When the lower-temperature buffer layer is being formed, it does not grow on the mask portion of the mask layer made of $SiO_2$ or $Si_3N_4$, but is only formed within the opening windows thereof.

In the method of making a GaN single crystal substrate in accordance with the present invention, it is preferable that the epitaxial layer be grown within a thickness range of 5 to 300 μm, and that the method further comprise, after the epitaxial layer growing step, a GaAs substrate eliminating step of eliminating the GaAs substrate and a step of growing on the epitaxial layer a second epitaxial layer made of GaN as a laminate.

In this case, since the GaAs substrate is eliminated before the second epitaxial layer is grown, thermal stress is prevented from occurring due to the difference in coefficient of thermal expansion between the GaAs substrate and the buffer layer/the epitaxial layer, so that cracks and internal stress occurring in the epitaxial layer can be reduced, whereby a GaN single crystal substrate with no cracks and greatly reduced crystal defects can be formed.

In the method of making a GaN single crystal substrate in accordance with the present invention, it is preferred that a plurality of the opening windows of the mask layer be arranged with a pitch L in a <10-10> direction of the lower epitaxial layer so as to form a <10-10> window group, a plurality of <10-10> window groups be arranged in parallel with a pitch d (0.75L≦d≦1.3L) in a <1-210> direction of the lower epitaxial layer, and the <10-10> window groups be arranged in parallel such that the center position of each opening window in each <10-10> window group shifts by about ½ L in the <10-10> direction from the center position of each opening window in the <10-10> window group adjacent thereto.

In this case, since the center position of each opening window of each <10-10> window group shifts by about ½ L in the <10-10> direction from the center position of each opening window in the <10-10> window group adjacent thereto, a crystal grain of GaN in a regular hexagonal pyramid or truncated regular hexagonal pyramid growing from each opening window connects with those growing from its adjacent opening windows without interstices while generating substantially no pits, whereby crystal defects and internal stress can be reduced in the epitaxial layer.

In the method of making a GaN single crystal substrate in accordance with the present invention, it is preferred that a plurality of the opening windows of the mask layer be arranged with a pitch L in a <11-2> direction on a (111) plane of the GaAs substrate so as to form a <11-2> window group, a plurality of <11-2> window groups be arranged in parallel with a pitch d (0.75L≦d≦1.3L) in a <-110> direction of the (111) plane of the GaAs substrate, and the <11-2> window groups be arranged in parallel such that the center position of each opening window in each <11-2> window group shifts by about ½ L in the <11-2> direction from the center position of each opening window in the <11-2> window group adjacent thereto.

In this case, since the center position of each opening window of each <11-2> window group shifts by about ½ L in the <11-2> direction from the center position of each opening window in the <11-2> window group adjacent thereto, a crystal grain of GaN in a regular hexagonal pyramid or truncated regular hexagonal pyramid growing from each opening window connects with those growing from its adjacent opening windows without interstices while generating substantially no pits, whereby crystal defects and internal stress can be reduced in the epitaxial layer.

In the method of making a GaN single crystal substrate in accordance with the present invention, it is preferred that the epitaxial layer be grown thick in the epitaxial layer growing step so as to form an ingot of GaN single crystal, and that the method further comprise a cutting step of cutting the ingot into a plurality of sheets.

In this case, since the ingot of GaN single crystal is cut into a plurality of sheets, a plurality of GaN single crystal substrates with reduced crystal defects can be obtained by a single manufacturing process.

In the method of making a GaN single crystal substrate in accordance with the present invention, it is preferred that the epitaxial layer be grown thick in the epitaxial layer growing step so as to form an ingot of GaN single crystal, and that the method further comprise a cleaving step of cleaving the ingot into a plurality of sheets.

In this case, since the ingot of GaN single crystal is cleaved into a plurality of sheets, a plurality of GaN single crystal substrates with reduced crystal defects can be obtained by a single manufacturing process. Also, since the ingot is cleaved along cleavage surfaces of the GaN crystal, a plurality of GaN single crystal substrates can easily be obtained in this case.

Preferably, the method of making a GaN single crystal in accordance with the present invention further comprises an ingot forming step of thickly growing on the GaN single crystal substrate obtained by the above-mentioned method an epitaxial layer made of GaN so as to form an ingot of GaN single crystal, and a cutting step of cutting the ingot into a plurality of sheets.

In this case, a plurality of GaN single crystal substrates can be obtained by simply growing a GaN epitaxial layer on the GaN single crystal substrate made by the above-mentioned method so as to form an ingot and then cutting the ingot. Namely, a plurality of GaN single crystal substrates with reduced crystal defects can be made by a simple operation.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

In the following, preferred embodiments of the present invention will be explained in detail with reference to the accompanying drawings. While there are cases where lattice directions and lattice planes are used for the explanation of individual embodiments, symbols for lattice directions and lattice planes will be explained here. Individual orientations, assembled orientations, individual planes, and assembled planes will be referred to with [], <>, ( ), and {}, respectively. Here, while negative indices are indicated by "−" (bar) on their numerical values in crystallography, a minus symbol will be attached in front of the numerical values for the convenience of preparing the specification.

First Embodiment

The GaN single crystal substrate in accordance with a first embodiment and a method of making the same will be explained with reference to the manufacturing step charts of FIGS. 1A to 1D.

Figure 1A:
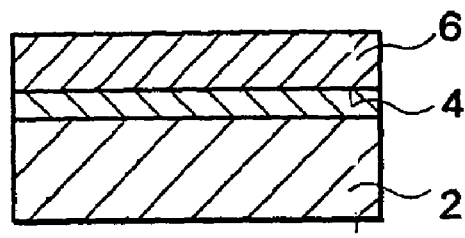
FIGS. 1A to 1D are views showing first to fourth steps of the method of making a GaN single crystal substrate in accordance with a first embodiment, respectively.

Initially, in the first step shown in FIG. 1A, a GaAs substrate 2 is installed within a reaction vessel of a vapor phase growth apparatus. Here, as the GaAs substrate 2, a GaAs(111)A substrate in which GaAs(111) plane is a Ga surface or a GaAs(111)B substrate in which GaAs(111) plane is an As surface can be employed.

After the GaAs substrate 2 is installed in the reaction vessel of the vapor phase growth apparatus, a buffer layer 4 made of GaN is formed on the GaAs substrate 2. The method of forming the buffer layer 4, includes vapor phase growth methods such as HVPE (Hydride Vapor Phase Epitaxy) method, organic metal chloride vapor phase growth method, and MOCVD method. Each of these vapor phase growth methods will now be explained in detail.

Figure 2:
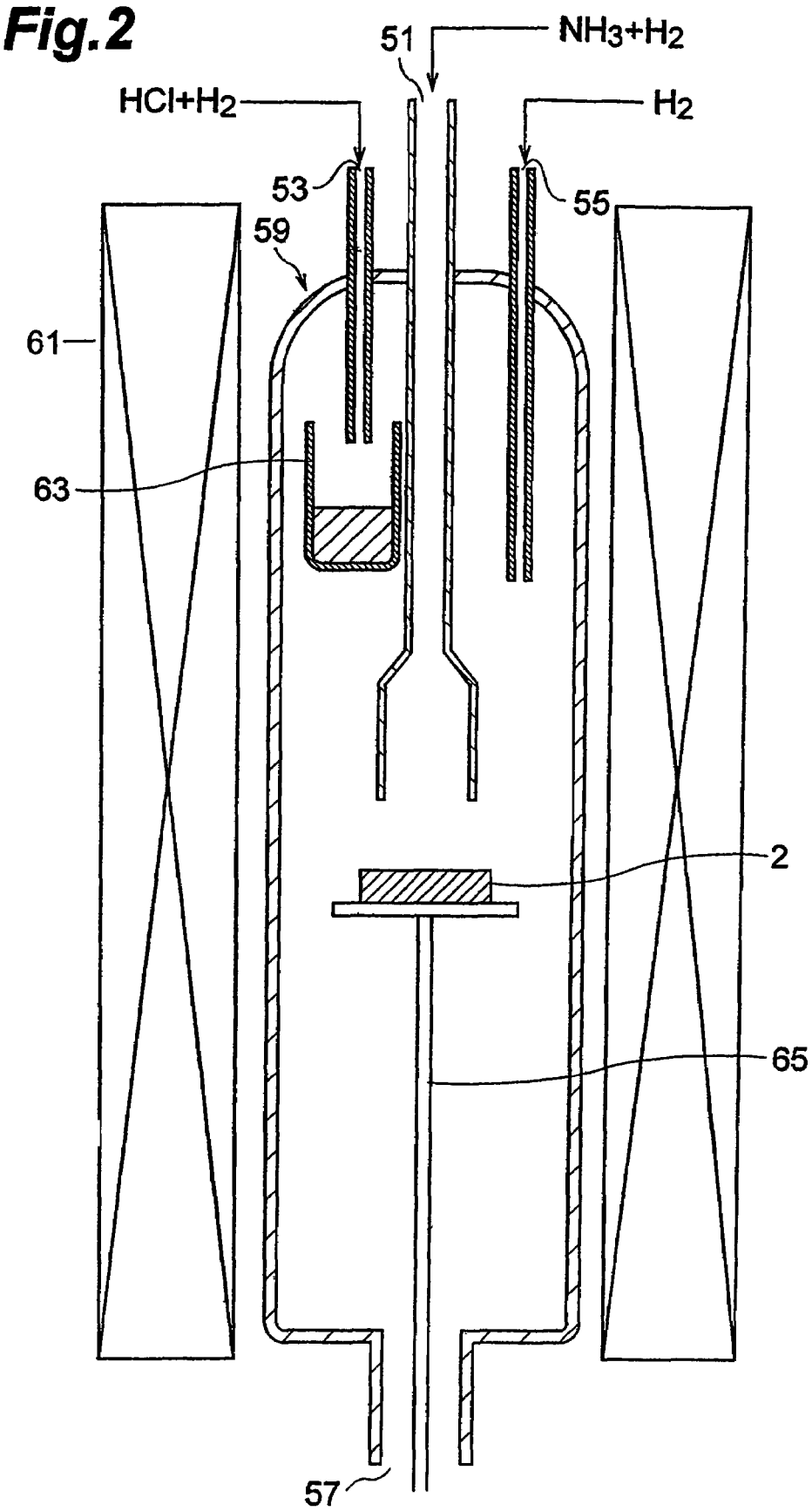
FIG. 2 is a view showing a vapor phase growth apparatus employed in HVPE method.

First, the HVPE method will be explained. FIG. 2 is a view showing a normal-pressure vapor phase growth apparatus used for the HVPE method. This apparatus is constituted by a reaction chamber 59 having a first gas introducing port 51, a second gas introducing port 53, a third gas introducing port 55, and an exhaust port 57; and a resistance heater 61 for heating the reaction chamber 59. Also, a Ga metal source boat 63 and a rotary support member 65 for supporting the GaAs substrate 2 are disposed within the reaction chamber 59.

A preferred method of forming the buffer layer 4 by use of such a vapor phase growth apparatus will now be explained. In the case where the GaAs(111)A substrate is employed as the GaAs substrate 2, hydrogen chloride (HCl) is introduced from the second gas introducing port 53 into the Ga metal source boat 63 at a partial pressure of $4 \times 10^{-4}$ atm to $4 \times 10^{-3}$ atm in a state where the GaAs substrate 2 is heated and held at a temperature of about 450° C. to 530° C. by the resistance heater 61. Upon this process, Ga metal and hydrogen chloride (HCl) react with each other, thereby yielding gallium chloride (GaCl). Subsequently, ammonia ($NH_3$) is introduced from the first gas introducing port 51 at a partial pressure of 0.1 atm to 0.3 atm, so that this $NH_3$ and GaCl react with each other near the GaAs substrate 2, thereby generating gallium nitride (GaN). Here, in the first gas introducing port 51 and the second gas introducing port 53, hydrogen ($H_2$) is introduced as a carrier gas. On the other hand, only hydrogen ($H_2$) is introduced in the third gas introducing port 55. As GaN is grown for about 20 minutes to about 40 minutes under such a condition, a buffer layer 4 made of GaN having a thickness of about 500 angstroms to about 1200 angstroms is formed on the GaAs substrate 2. In the case using the HVPE method, the growth rate of the buffer layer does not change much even when the amount of synthesis of gallium chloride (GaCl) is increased, whereby the reaction is assumed to determine the rate.

In the case where the GaAs (111)B substrate is employed as the GaAs substrate 2, a buffer layer can be formed under a condition substantially similar to that in the case where the GaAs(111)A substrate is used.

Figure 3:
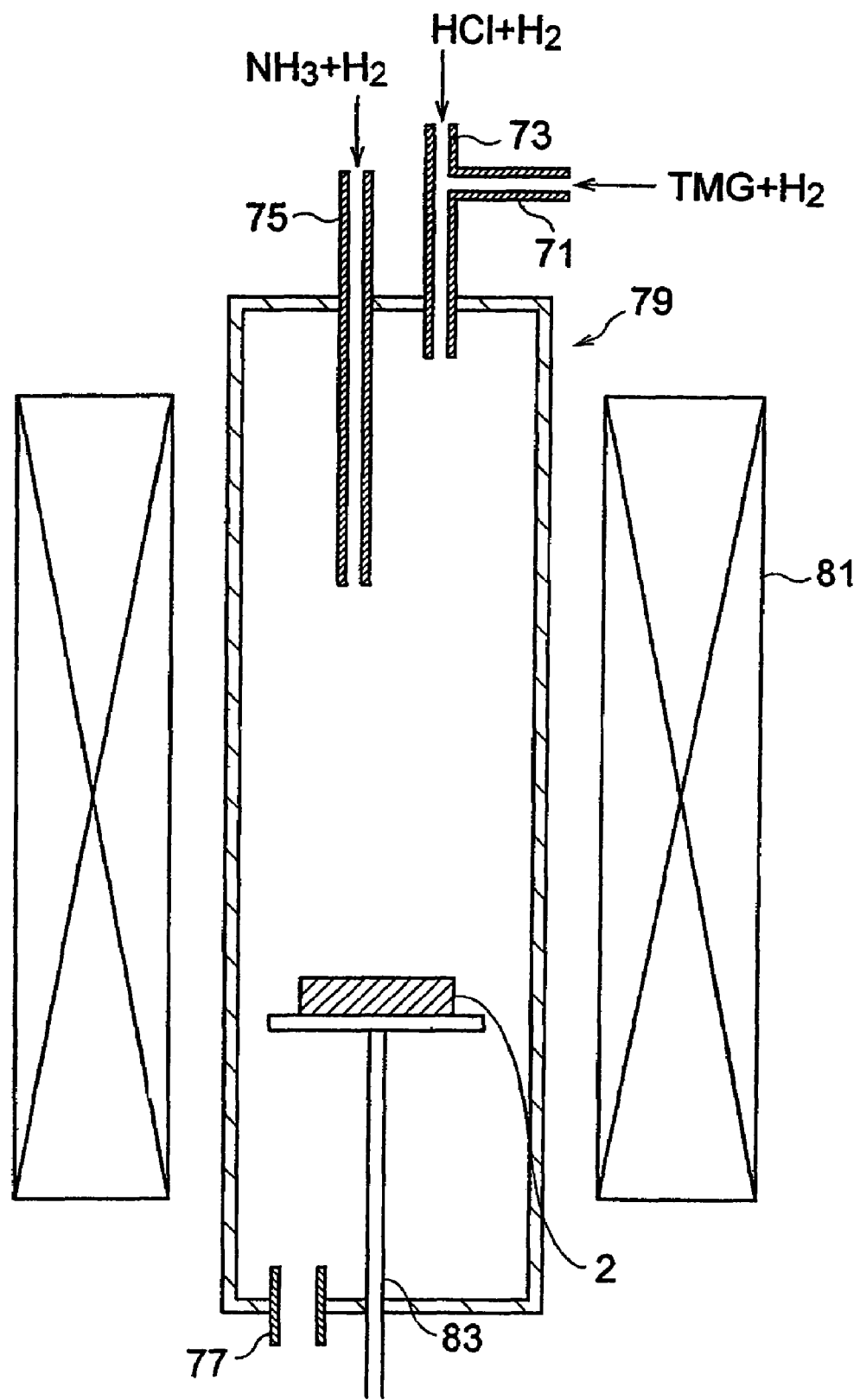
FIG. 3 is a view showing a vapor phase growth apparatus employed in organic metal chloride vapor phase growth method.

The organic metal chloride vapor phase growth method will now be explained. FIG. 3 is a view showing a growth apparatus used for the organic metal chloride vapor phase growth method. This apparatus is constituted by a reaction chamber 79 having a first gas introducing port 71, a second gas introducing port 73, a third gas introducing port 75, and an exhaust port 77; and a resistance heater 81 for heating the reaction chamber 79. Also, a rotary support member 83 for supporting the GaAs substrate 2 is disposed within the reaction chamber 79.

A method of forming the buffer layer 4 by use of such a growth apparatus will now be explained. In the case where the GaAs(111)A substrate is employed as the GaAs substrate 2, in a state where the GaAs substrate 2 is heated and held at a temperature of about 450° C. to 530° C. by the resistance heater 81, while trimethyl gallium (TMG) is introduced from the first gas introducing port 71 at a partial pressure of $4\times10^{-4}$ atm to $2\times10^{-3}$ atm, an equivalent amount of hydrogen chloride (HCl) is introduced from the second gas introducing port 73 at a partial pressure of $4\times10^{-4}$ atm to $2\times10^{-3}$ atm. Upon this process, trimethyl gallium (TMG) and hydrogen chloride (HCl) react with each other, thereby yielding gallium chloride (GaCl). Subsequently, ammonia ($NH_3$) is introduced from the third gas introducing port 75 at a partial pressure of 0.1 atm to 0.3 atm, so that this $NH^3$ and GaCl react with each other near the GaAs substrate 2, thereby generating gallium nitride (GaN). Here, in each of the first gas introducing port 71, the second gas introducing port 73, and the third gas introducing port 75, hydrogen ($H_2$) is introduced as a carrier gas. As GaN is grown for about 20 minutes to about 40 minutes under such a condition, a buffer layer 4 made of GaN having a thickness of about 500 angstroms to about 1200 angstroms is formed on the GaAs substrate 2. Here, the growth rate of the buffer layer 4 can be set to about 0.08 µm/hr to about 0.18 µm/hr.

In the case where the GaAs(111)B substrate is employed as the GaAs substrate 2, a buffer layer can be formed under a condition substantially similar to that in the case where the GaAs(111)A substrate is used.

The MOCVD method is a method in which, in a cold wall type reactor, an organic metal including Ga, such as trimethyl gallium (TMG), for example, and ammonia ($NH_3$) are sprayed onto a heated GaAs substrate 2 together with a carrier gas, so as to grow GaN on the GaAs substrate 2. Preferably, the temperature of the GaAs substrate 2 when the organic metal including Ga and the like are sprayed thereon is about 450° C. to about 600° C. when the GaAs(111)A substrate is used, and about 450° C. to about 550° C. when the GaAs(111)B substrate is used. As the organic metal including Ga, not only TMG but also triethyl gallium (TEG) or the like, for example, can be used.

The above are vapor phase growth methods for forming the buffer layer 4. After the buffer layer 4 is formed, a first epitaxial layer (lower epitaxial layer) 6 made of GaN is grown on the buffer layer 4. For growing the first epitaxial layer 6, vapor phase growth methods such as HVPE method, organic metal chloride vapor phase growth method, and MOCVD method can be used as in the method of forming the buffer layer 4. Preferred conditions in the case where the first epitaxial layer 6 is grown by these vapor phase growth methods will now be explained.

In the case where the first epitaxial layer 6 is grown by the HVPE method, the apparatus shown in FIG. 2 can be used as in the forming of the buffer layer 4. When the GaAs (111)A substrate is employed as the GaAs substrate 2, the first epitaxial layer 6 is grown in a state where the GaAs substrate 2 is heated and held at a temperature of about 920° C. to about 1030° C. by the resistance heater 61. Here, the growth rate of the first epitaxial layer 6 can be set to about 20 µm/hr to about 200 µm/hr. The growth rate largely depends on the GaCl partial pressure, i.e., HCl partial pressure, whereas the HCl partial pressure can lie within the range of $5\times10^{-4}$ atm to $5\times10^{-2}$ atm. When the GaAs(111)B substrate is employed as the GaAs substrate 2, on the other hand, the first epitaxial layer 6 is grown in a state where the GaAs substrate 2 is heated and held at a temperature of about 850° C. to about 950° C. by the resistance heater 61.

In the case where the first epitaxial layer 6 is grown by the organic metal chloride vapor phase growth method, the apparatus shown in FIG. 3 can be used as in the forming of the buffer layer 4. When the GaAs(111)A substrate is employed as the GaAs substrate 2, the first epitaxial layer 6 is grown in a state where the GaAs substrate 2 is heated and held at a temperature of about 920° C. to about 1030° C. by the resistance heater 81. Here, the growth rate of the first epitaxial layer 6 can be set to about 10 µm/hr to about 60 µm/hr. For increasing the growth rate, the partial pressure of TMG may be enhanced so as to increase the partial pressure of GaCl. At a partial pressure not lower than the equilibrium vapor pressure of TMG at a temperature of its gas pipe, however, TMG liquefies upon the inner wall of the gas pipe, thereby contaminating or clogging the pipe. Therefore, the partial pressure of TMG cannot be raised excessively, and its upper limit is considered to be about $5\times10^{-3}$ atm. Consequently, the upper limit of growth rate is considered to be about 60 µm/hr.

When the GaAs(111)B substrate is employed as the GaAs substrate 2, on the other hand, the first epitaxial layer 6 is grown in a state where the GaAs substrate 2 is heated and held at a temperature of about 850° C. to about 950° C. by the resistance heater 81. Here, the growth rate of the first epitaxial layer 6 can be set to about 10 µm/hr to about 50 µm/hr. The upper limit of partial pressure of trimethyl gallium or the like introduced in the reaction chamber 79 is $5\times10^{-3}$ atm due to the reason mentioned above.

In the case where the first epitaxial layer 6 is grown by the MOCVD method, the temperature of the GaAs substrate 2 when an organic metal including Ga and the like are sprayed thereon is preferably about 750° C. to about 900° C. when the GaAs(111)A substrate is employed, and about 730° C. to about 820° C. when the GaAs(111)B substrate is employed. The above are growth conditions for the first epitaxial layer 6.

The second step shown in FIG. 1B will now be explained. In the second step shown in FIG. 1B, a wafer in the middle of its manufacture is taken out of the growth apparatus, and a mask layer 8 made of SiN or $SiO_2$ is formed on the epitaxial layer 6. For forming the mask layer 8, an SiN film or $SiO_2$ film having a thickness of about 100 nm to about 500 nm is formed by plasma CVD or the like, and this SiN film or $SiO_2$ film is patterned by photolithography technique.

Figure 1B:
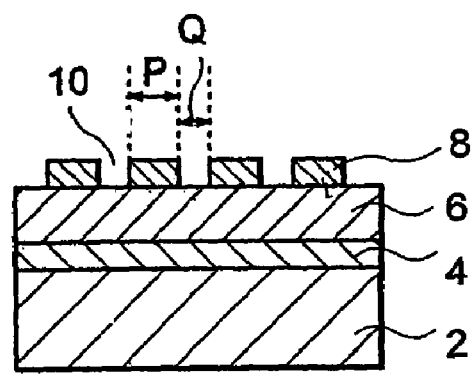
Figure 4:
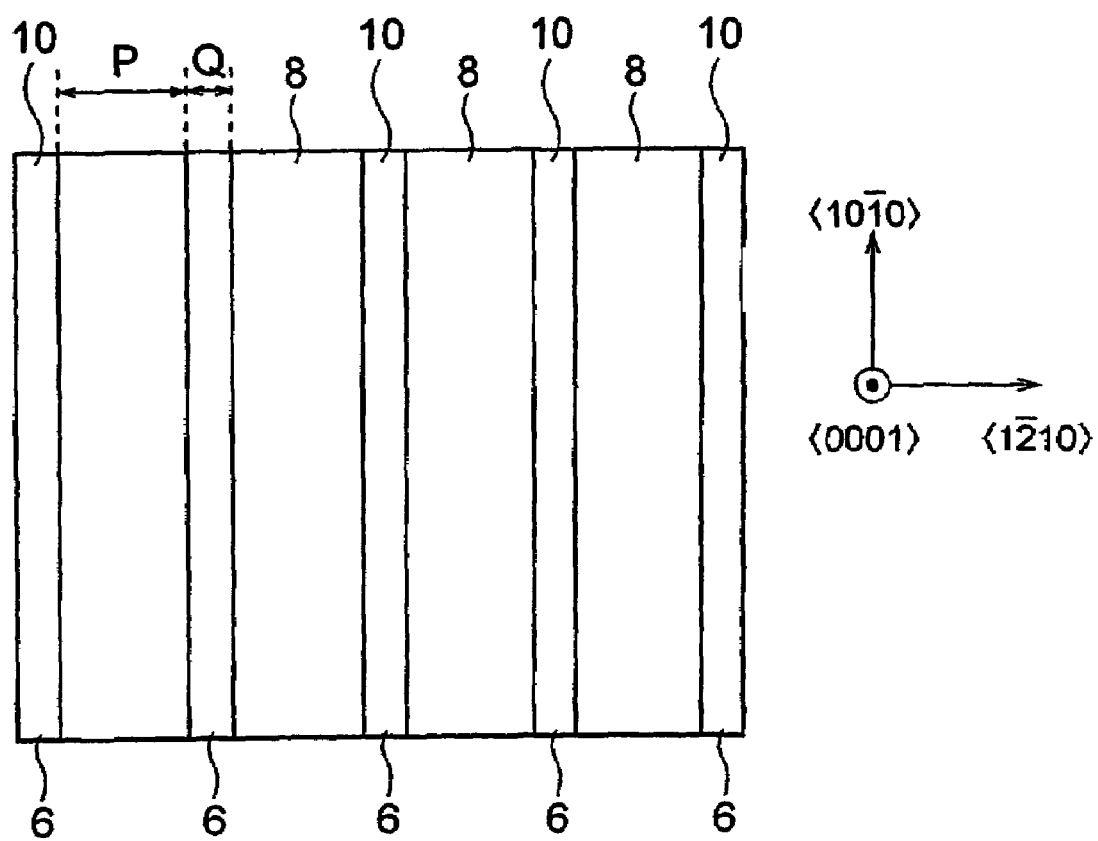
FIG. 4 is a plan view of a mask layer in the first embodiment.

FIG. 4 is a plan view of the wafer in the second step shown in FIG. 1B. As shown in FIGS. 1B and 4, the mask layer 8 in this embodiment is formed with a plurality of stripe windows 10 shaped like stripes. The stripe windows 10 are formed so as to extend in the <10-10> direction of the first epitaxial layer 6 made of GaN. Here, the arrows in FIG. 4 indicate the crystal orientations of the first epitaxial layer 6.

Figure 1C:
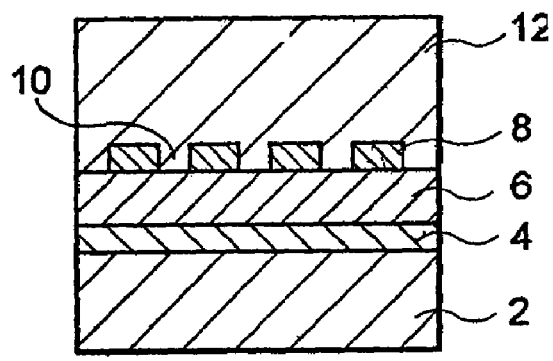

After the mask layer 8 is formed, the third step shown in FIG. 1C is taken. In the third step, the wafer formed with the mask layer 8 is installed in the reaction vessel of the vapor phase growth apparatus again. Then, a second epitaxial layer 12 is grown on the mask layer 8 and on the part of the first epitaxial layer 6 exposed through the stripe windows 10. As in the method of growing the first epitaxial layer 6, the method of growing the second epitaxial layer 12 includes the HVPE method, organic metal chloride vapor growth method, MOCVD method, and the like. Preferably, the thickness of the second epitaxial layer 12 is about 150 µm to about 1000 µm.

Figure 5A:
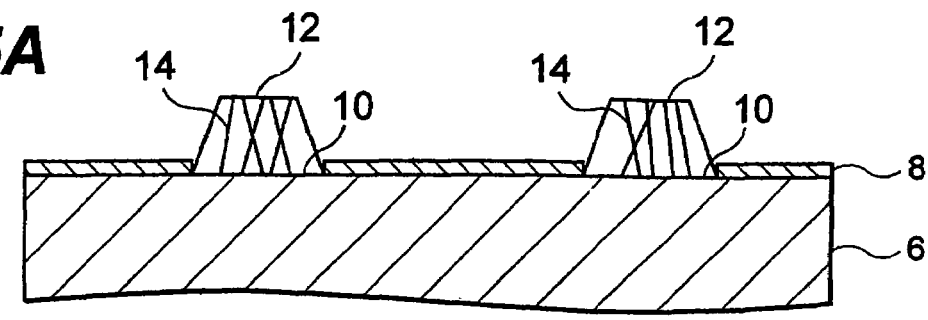
FIGS. 5A to 5D are views showing first to fourth steps of epitaxial growth in accordance with the first embodiment, respectively.
Figure 5B:
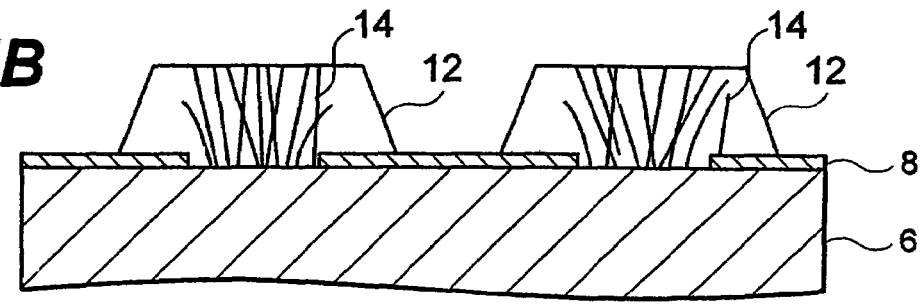
Figure 5C:
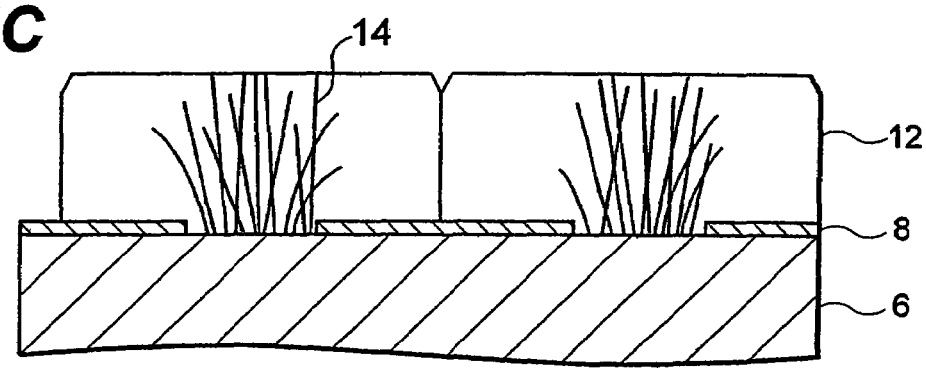
Figure 5D:
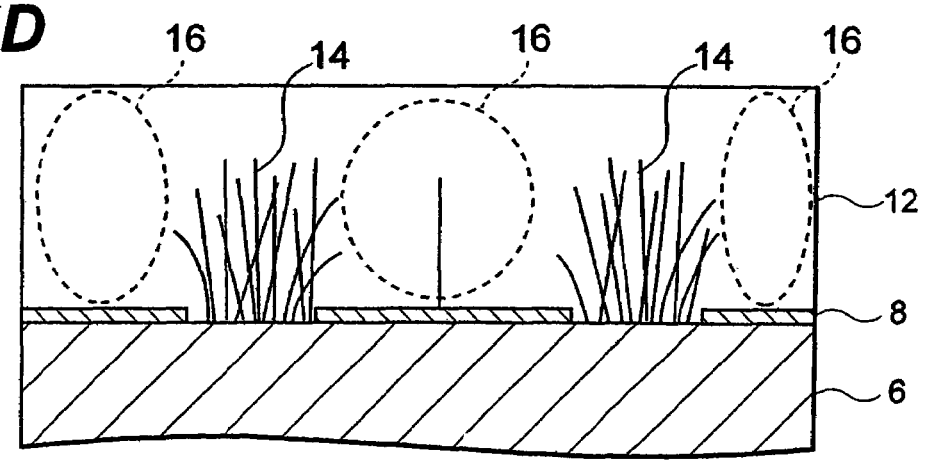

With reference to FIGS. 5A to 5D, the process of growing the second epitaxial layer 12 will be explained in detail. At the initial growing stage of the second epitaxial layer 12 made of GaN, as shown in FIG. 5A, the second epitaxial layer 12 does not grow on the mask layer 8, but grows only on the first epitaxial layer 6 within the stripe windows 10 as GaN nuclei. As the growth advances, the second epitaxial layer 12 increases its thickness. Along with this increase in thickness, lateral growth of the second epitaxial layer 12 occurs on the mask layer 8. Consequently, as shown in FIG. 5C, parts of the epitaxial layer 12 grown from both sides connect with each other, so as to be integrated together. After being integrated upon lateral growth, the second epitaxial layer 12 grows upward as shown in FIG. 5D, thereby enhancing its thickness. As parts of the second epitaxial layer 12 integrate with their adjacent parts upon lateral growth, its growth rate in the thickness direction becomes faster than that before integration. The above is the growing process of the second epitaxial layer 12.

Here, since the stripe windows 10 are formed so as to extend in the <10-10> direction of the first epitaxial layer 6 made of GaN as noted in the explanation of FIG. 4, the widthwise direction of the stripe windows 10 and the <1-210> direction of the first epitaxial layer 6 substantially align with each other. Since the GaN epitaxial layer grows in the <1-210> direction at a higher rate in general, the time required for adjacent parts of the second epitaxial layer 12 to integrate with each other after starting the lateral growth is shortened. As a consequence, the growth rate of the second epitaxial layer 12 increases.

It is not always necessary for the stripe windows 10 to extend in the <10-10> direction of the first epitaxial layer 6. For example, they may be formed so as to extend in the <1-210> direction of the epitaxial layer 6.

The dislocation density of the second epitaxial layer 12 will now be explained. As shown in FIG. 5A, a plurality of dislocations 14 exist within the second epitaxial layer 12. However, as shown in FIG. 5D, the dislocations hardly spread sidewise even when the second epitaxial layer 12 grows in lateral directions. Also, even if the dislocations 14 spread sidewise, they will extend horizontally without becoming through dislocations which penetrate through the upper and lower surfaces. Hence, a low dislocation density region 16 having a dislocation density lower than that in the area above the stripe windows 10 is formed above the part of the mask layer 8 not formed with the stripe windows 10 (hereinafter referred to as "mask portion"). As a consequence, the dislocation density of the second epitaxial layer 12 can be reduced. Also, the dislocations 14 hardly extend upward when the epitaxial layer 12 rapidly grows upward from the state of FIG. 5C where the adjacent parts of the epitaxial layer 12 are integrated with each other due to the lateral growth. Therefore, the upper surface of the second epitaxial layer 12 is free from voids and through dislocations, thereby being excellent in its embedding property and flatness.

After the second epitaxial layer 12 is formed as mentioned above, the fourth step shown in FIG. 1D is taken. In the fourth step, the wafer is installed in an etching apparatus, and the GaAs substrate 2 is completely eliminated with an ammonia type etching liquid. Further, after the GaAs substrate 2 is eliminated, the surface where the GaAs substrate 2 has been eliminated, i.e., the lower surface of the buffer layer 4, is subjected to grinding, whereby a GaN single crystal substrate 13 in accordance with this embodiment is completed.

Here, in the case where anomalous grain growth is generated in a part of the second epitaxial layer 12 or where the layer thickness of the second epitaxial layer 12 has become uneven, the upper surface of the second epitaxial layer 12 is subjected to grinding, so as to be finished as a mirror surface. Specifically, it is preferred that the upper surface of the second epitaxial layer 12 be subjected to lapping and then to buffing.

The width P of the mask portion shown in FIGS. 1B and 4 is preferably within the range of about 2 μm to about 20 μm. If the width P of the mask portion is smaller than the lower limit of the above-mentioned range, then the effect of lateral growth of the second epitaxial layer 12 tends to lower. If the width P is greater than the upper limit of the above-mentioned range, then the growth time of the second epitaxial layer 12 tends to increase, thereby lowering the mass productivity thereof. The window width Q of the stripe windows 10 is preferably within the range of about 0.3 μm to about 10 μm. If the window width Q of the stripe windows 10 lies within this range, then the effect of the mask can be fulfilled.

Though the case of growing the buffer layer 4 made of GaN is mentioned in the first step shown in FIG. 1A, the buffer layer 4 made of AlN instead of GaN may be grown. In this case, the MOVPE method can be used. Specifically, after the reaction vessel is sufficiently evacuated, hydrogen, as a carrier gas, and trimethyl aluminum (TMA) and ammonia ($NH_3$), as material gases, are introduced at a normal pressure in a state where the GaAs substrate 2 is heated and held at a temperature of about 550° C. to about 700° C. when the GaAs(111)A substrate is employed, and also at a temperature of about 550° C. to about 700° C. when the GaAs(111)B substrate is employed. Upon such a treatment, a buffer layer made of AlN having a thickness of about 100 angstroms to about 1000 angstroms is formed on the GaAs substrate 2.

Second Embodiment

The GaN single crystal substrate in accordance with a second embodiment and a method of making the same will be explained with reference to the manufacturing step charts of FIGS. 6A to 6D.

Figure 6A:
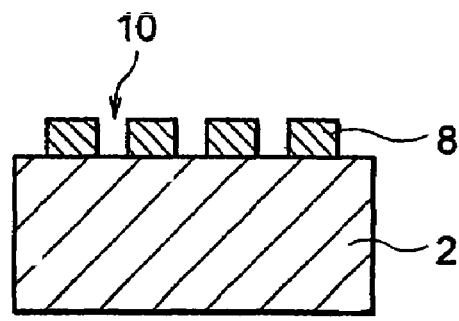
FIGS. 6A to 6D are views showing first to fourth steps of the method of making a GaN single crystal substrate in accordance with a second embodiment, respectively.

Initially, in the first step shown in FIG. 6A, a mask layer 8 made of SiN or $SiO_2$ is directly formed on a GaAs substrate 2. For forming the mask layer 8, an SiN film or $SiO_2$ film having a thickness of about 100 nm to about 500 nm is formed by plasma CVD or the like, and this SiN film or $SiO_2$ film is patterned by photolithography technique.

Figure 7:
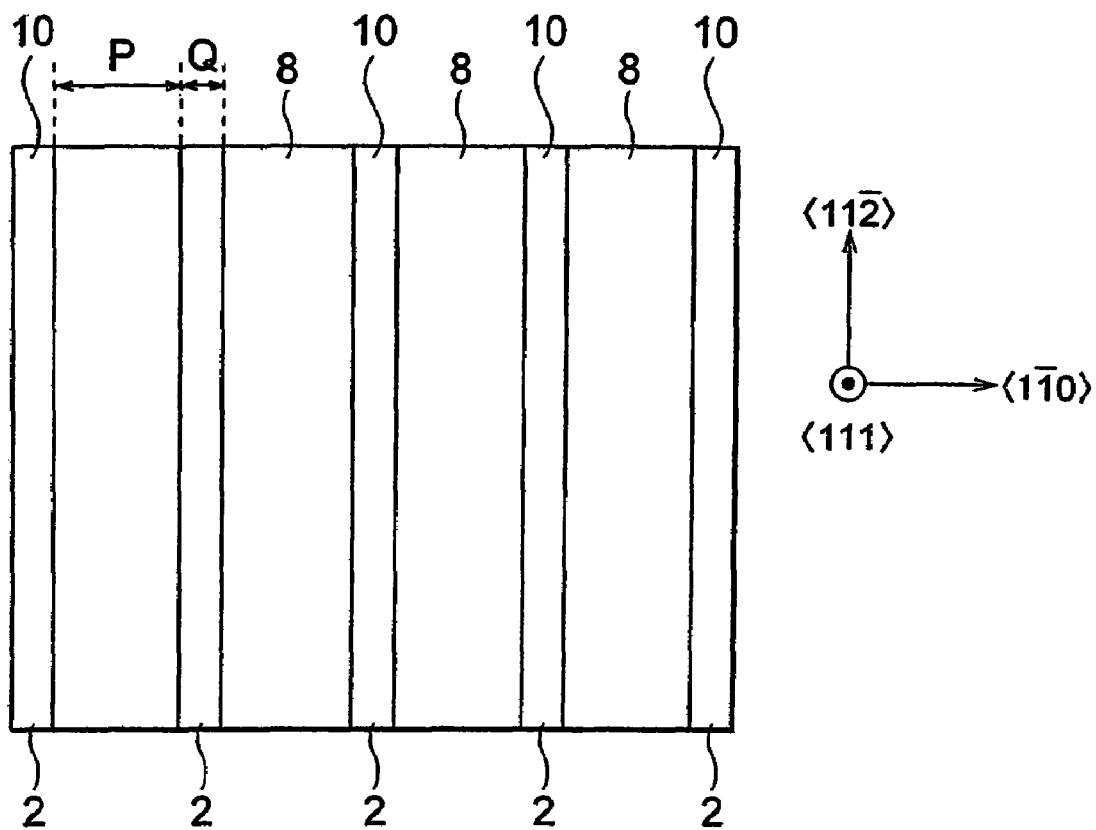
FIG. 7 is a plan view of a mask layer in the second embodiment.

FIG. 7 is a plan view of the wafer in the first step shown in FIG. 6A. As shown in FIGS. 6A and 7, the mask layer 8 of this embodiment is also formed with a plurality of stripe windows 10 shaped like stripes as in the first embodiment. The stripe windows 10 are formed so as to extend in the <11-2> direction of the GaAs substrate 2. The arrows in FIG. 7 indicate the crystal orientations of the GaAs substrate 2.

Figure 6B:
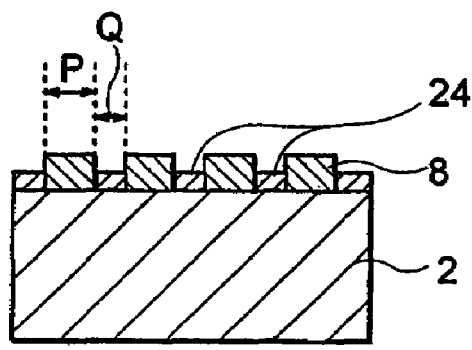

After the mask layer 8 is formed, the second step shown in FIG. 6B is taken, so as to form a buffer layer 24 on the GaAs substrate 2 within the stripe windows 10. As in the first embodiment, the buffer layer 24 can be formed by the HVPE method, organic metal chloride vapor phase growth method, MOCVD method, and the like. The thickness of the buffer layer 24 is preferably about 50 nm to about 120 nm.

Figure 6C:
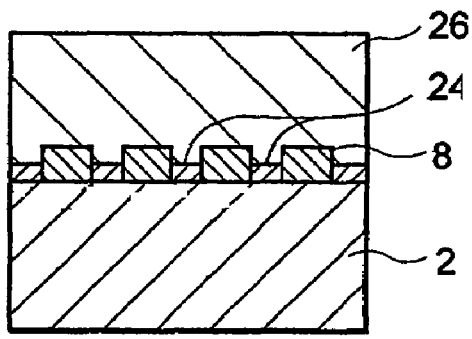

Subsequently, in the third step shown in FIG. 6C, an epitaxial layer 26 made of GaN is grown on the buffer layer 24. Preferably, the epitaxial layer 26 is grown to a thickness of about 150 μm to about 1000 μm by the HVPE method, organic metal chloride vapor phase growth method, MOCVD method, and the like as in the first embodiment. Also, in this case, the lateral growth of the epitaxial layer can reduce crystal defects of the epitaxial layer 26, such as those above the mask portion of the mask layer 8 and on the upper surface of the epitaxial layer 26 in particular.

Here, since the stripe windows 10 are formed so as to extend in the <11-2> direction of the GaAs substrate 2 as mentioned above, the widthwise direction of the stripe windows 10 and the <1-10> direction of the GaAs substrate 2 substantially align with each other. Since the GaN epitaxial layer grows in the <1-10> direction at a higher rate in general, the time required for adjacent parts of the epitaxial layer 26 to integrate with each other after starting the lateral growth is shortened. As a consequence, the growth rate of the epitaxial layer 26 increases.

It is not always necessary for the stripe windows 10 to extend in the <11-2> direction of the GaAs substrate 2. For example, they may be formed so as to extend in the <1-10> direction of the GaAs substrate 2.

Figure 6D:
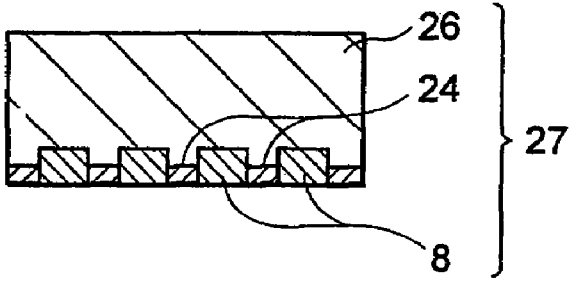

After the epitaxial layer 26 is grown, the fourth step shown in FIG. 6D is taken, so as to eliminate the GaAs substrate 2, whereby a GaN single crystal substrate 27 of this embodiment is accomplished. An example of the method of eliminating the GaAs substrate 2 is etching. When subjected to wet etching with an ammonia type etching for about an hour, the GaAs substrate 2 can be eliminated. Also, the GaAs substrate may be subjected to wet etching with aqua regia. After the GaAs substrate 2 is eliminated, the surface where the GaAs substrate 2 has been eliminated, i.e., the lower surface of the mask layer 8 and buffer layer 24, may be subjected to grinding. Further, as in the first embodiment, the upper surface of the epitaxial layer 26 may be subjected to grinding.

As explained in the foregoing, the method of making a GaN single crystal substrate in accordance with this embodiment can make a GaN substrate with less crystal defects and less internal stress by growing an epitaxial layer only once, thereby reducing the number of manufacturing steps and cutting down the cost as compared with the first embodiment.

Third Embodiment

Before explaining a third embodiment, how the GaN single crystal substrate and method of making the same in accordance with this embodiment have been accomplished will be explained.

For satisfying the demand for improving characteristics of optical semiconductor devices, the inventors have repeated trial and error in order to manufacture a GaN substrate having a higher quality. As a result, the inventors have found it important to reduce the internal stress of the grown GaN epitaxial layer for making a high-quality GaN substrate.

In general, the internal stress of the GaN epitaxial layer can be studied as being divided into thermal stress and true internal stress. This thermal stress occurs due to the difference in coefficient of thermal stress between the GaAs substrate and the epitaxial layer. Though the warping direction of the GaN substrate can be expected from the thermal stress, it has become clear that the true internal stress exists in the GaN epitaxial layer due to the fact that the actual warpage of the whole GaN substrate is directed opposite to the expected direction and due to the fact that large warpage also occurs after the GaAs substrate is eliminated.

The true internal stress exists from the initial stage of growth, and the true internal stress in the grown GaN epitaxial layer has been found to be on the order of $0.2 \times 10^9$ to $2.0 \times 10^9$ dyn/cm$^2$ as a result of measurement. Here, Stoney's expression used for calculating the true internal stress will be explained. In a wafer having a thin film formed on a substrate, the internal stress σ is given by the following expression (1):

$$\sigma = \frac{Eb^2\delta}{3(1-\nu)l^2d}$$

where σ is the internal stress, E is the modulus of rigidity, υ is the Poisson ratio, b is the thickness of the substrate, d is the thickness of the thin film, l is the diameter of the substrate, and δ is the flexure of the wafer. In the case of GaN single crystal, d=b, thereby yielding the following expression (2):

$$\sigma = \frac{Ed\delta}{3(1-\nu)l^2}$$

where the symbols indicate the same items as those in expression (1). According to this expression (2), the inventors have calculated values of true internal stress in epitaxial layers such as those mentioned above.

If internal stress such as true internal stress or thermal stress exists, then the substrate may warp or generate cracks and the like therein, whereby a wide-area, high-quality GaN single crystal substrate cannot be obtained. Therefore, the inventors have studied causes of true internal stress. The following are thus attained causes of true internal stress. In general, crystals have a hexagonal pillar form, while grain boundaries with a slight inclination exist in interfaces of these pillar grains, whereby mismatches in atomic sequences are observed. Further, many dislocations exist in the GaN epitaxial layer. These grain boundaries and dislocations cause the GaN epitaxial layer to shrink its volume through proliferation or extinction of defects, thereby generating the true internal stress.

The GaN single crystal substrates in accordance with third to seventh embodiments and methods of making the same are embodiments of the present invention accomplished in view of the above-mentioned causes for the true internal stress.

The GaN single crystal substrate in accordance with the third embodiment and a method of making the same will now be explained with reference to the manufacturing step charts of FIGS. 8A to 8D.

Figure 8A:
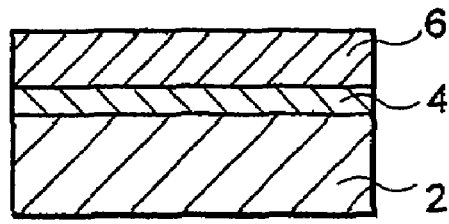
FIGS. 8A to 8D are views showing first to fourth steps of the method of making a GaN single crystal substrate in accordance with a third embodiment, respectively.

In the first step shown in FIG. 8A, according to a method similar to that in the first embodiment, a buffer layer 4 made of GaN and a first epitaxial layer (lower epitaxial layer) 6 made of GaN are grown on a GaAs substrate 2. Subsequently, in the second step shown in FIG. 8B, a mask layer 28 made of SiN or SiO$_2$ is formed on the first epitaxial layer 6. This embodiment differs from the first embodiment in the form of the mask layer 28.

Figure 9:
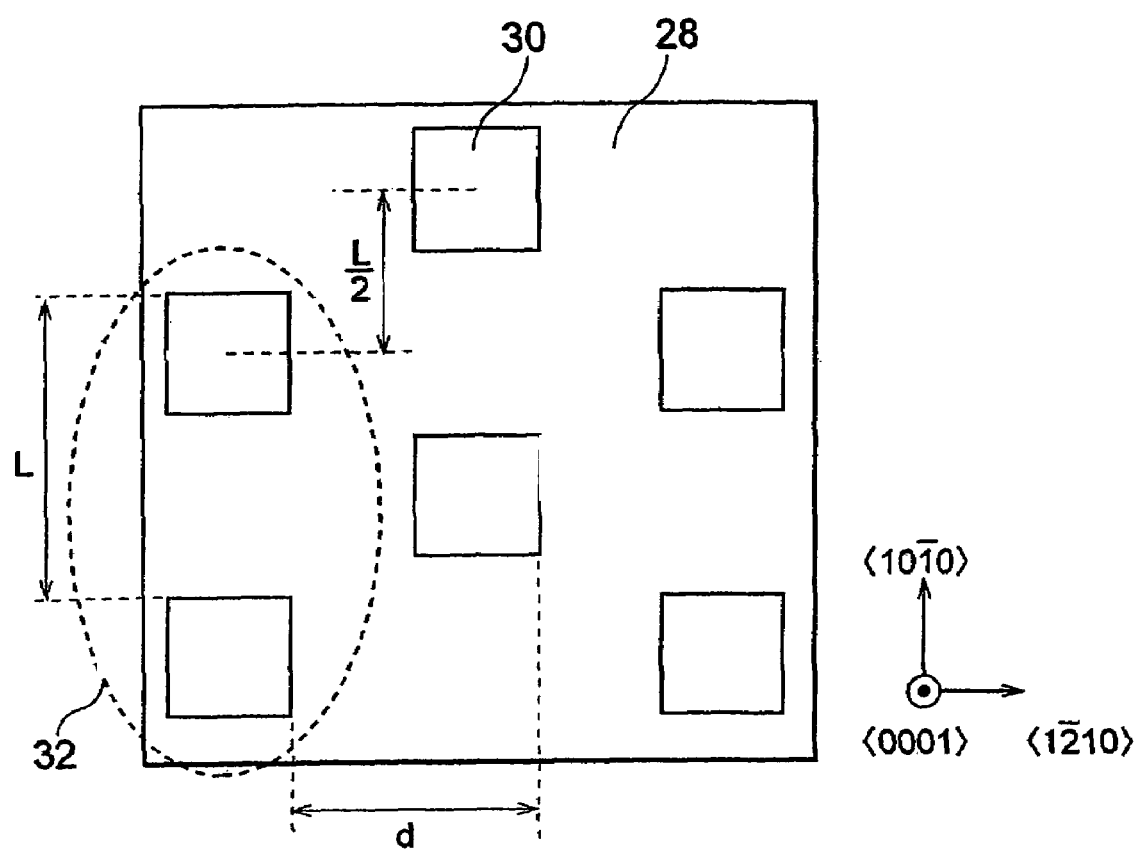
FIG. 9 is a plan view of a mask layer in the third embodiment.

Here, referring to FIG. 9, the form of the mask layer 28 will be explained. In this embodiment, as shown in FIG. 9, the mask layer 28 is formed with a plurality of square opening windows 30. The opening windows 30 are arranged with a pitch L in the <10-10> direction of the first epitaxial layer 6, so as to form a <10-10> window group 32. A plurality of <10-10> window groups 32 are arranged in parallel with a pitch d in the <1-210> direction of the first epitaxial layer 6, while the center position of each opening window 30 in each <10-10> window group 32 shifts by ½ L in the <10-10> direction from the center position of each opening window 30 in the <10-10> window group 32 adjacent thereto. Here, the center position of each opening window 30 refers to the position of center of gravity of each opening window 30. Each opening window 30 is a square having a side length of 2 μm, the pitch L is 6 μm, and the pitch d is 5 μm.

Subsequently, in the third step shown in FIG. 8C, a second epitaxial layer 34 is grown on the mask layer 28 by a method similar to that in the first embodiment.

Figure 10A:
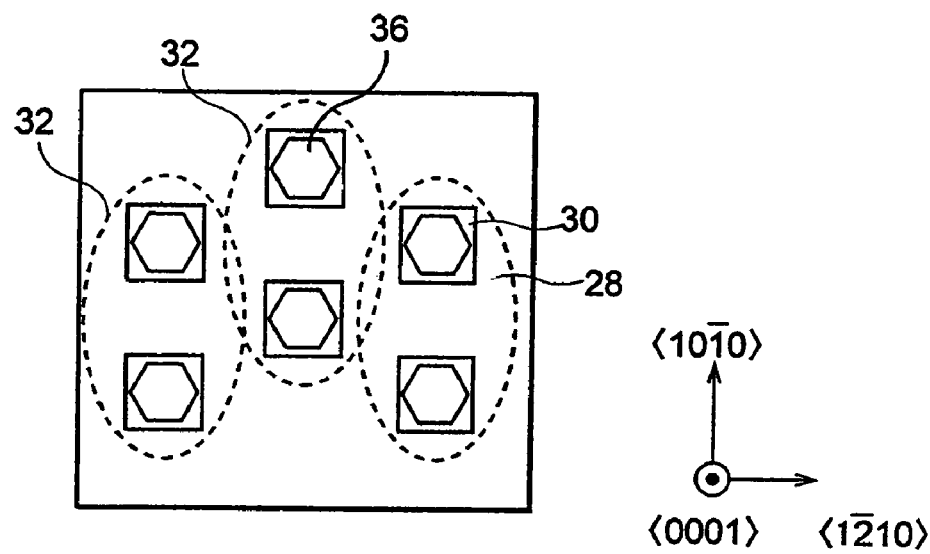
FIGS. 10A and 10B are views each showing a process of growing a second epitaxial layer in accordance with the third embodiment, respectively.
Figure 10B:
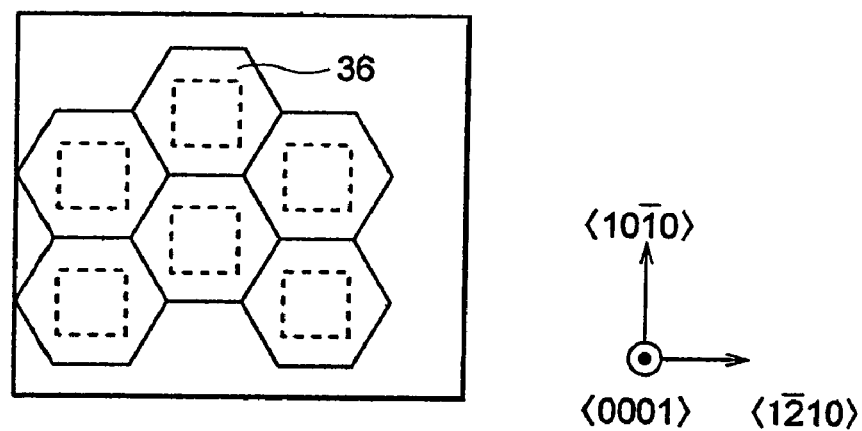

Here, referring to FIGS. 10A and 10B, the process of growing the second epitaxial layer 34 will be explained. FIG. 10A shows an initial growing stage of the second epitaxial layer 34. As shown in this drawing, a GaN crystal grain 36 in a regular hexagonal pyramid or truncated regular hexagonal pyramid grows from each opening window 30 at the initial growing stage. Subsequently, as shown in FIG. 10B, upon lateral growth of GaN crystal grains 36 onto the mask layer 28, each GaN crystal grain 36 connects with other GaN crystal grains 36 without forming any interstices (pits) therebetween. Then, the individual GaN crystal grains 36 cover the mask layer 28, whereby a second epitaxial layer 34 having a mirror surface is formed.

Namely, since a plurality of <10-10> window groups 32 are arranged in parallel in the <1-210> direction, while the center position of each opening window 30 shifts by ½ L in the <10-10> direction, the GaN crystal grains 36 in truncated regular hexagonal pyramids grow without substantially generating interstices, whereby the true internal stress is greatly lowered.

Also, as in the first embodiment, dislocations hardly occur in the region of the second epitaxial layer 34 above the mask portion of the mask layer 28 due to the effect of lateral growth of the GaN crystal grains 36.

Figure 8B:
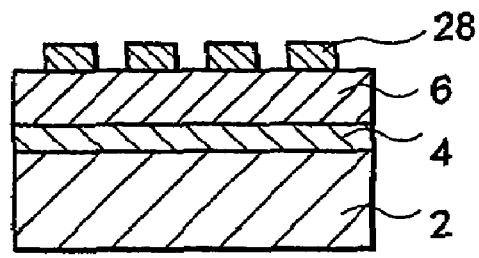
Figure 8C:
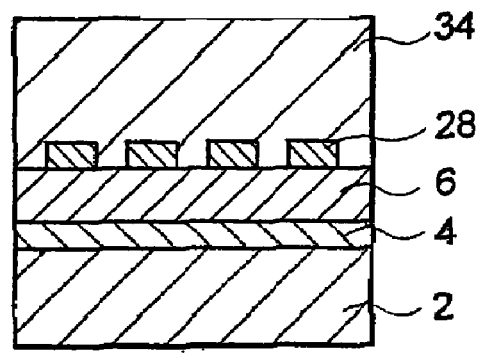
Figure 8D:
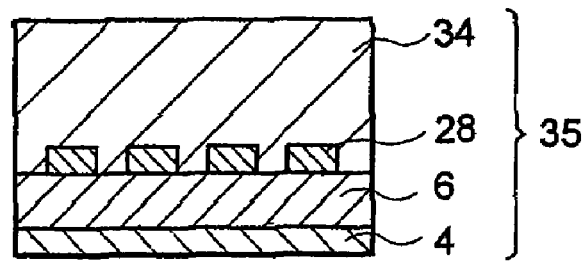

After the second epitaxial layer 34 is grown, the fourth step shown in FIG. 8D is taken, so as to eliminate the GaAs substrate 2 by an etching treatment or the like, whereby a GaN single crystal substrate 35 of this embodiment is accomplished.

In this embodiment, as mentioned above, each opening window 30 of the mask layer 28 is formed as a square having a side of 2 μm. Without being restricted thereto, it is desirable that the form and size of the opening window 30 in the mask layer 28 be adjusted according to growth conditions and the like as appropriate. For example, it can be formed as a square having a side of 1 to 5 μm, or a circle having a diameter of 1 to 5 μm. Further, without being restricted to the square and circle, each window 30 may be shaped like an ellipse or a polygon. In this case, it is desirable that each opening window 30 have an area of 0.7 μm² to 50 μm². If the area of each opening window 30 exceeds the upper limit of this range, then defects tend to occur more often in the epitaxial layer 34 within each opening window 30, thereby increasing internal stress. If the area of each opening window 30 is less than the lower limit of the range, by contrast, then it becomes harder to form each opening window 30, and the growth rate of the epitaxial layer 34 tends to decrease. It is also desirable that the total area of individual opening windows 30 be 10% to 50% of the whole area of the mask layer 28 including all the opening windows 30 and the mask portion. If the total area of the individual opening windows 30 lies within this range, then the defect density and internal stress of the GaN single crystal substrate can be reduced remarkably.

While the pitches L and d are set to 6 μm and 5 μm in this embodiment, respectively, they are not deemed to be restrictive. It is desirable that the pitch L be within the range of 3 to 10 μm. If the pitch L is longer than 10 μm, then the time required for the GaN crystal grains 36 to connect with each other increases, thereby consuming much time for growing the second epitaxial layer 34. If the pitch L is shorter than 3 μm, by contrast, the distance by which the crystal grains 36 laterally grow becomes shorter, thereby lowering the effect of lateral growth. Due to a similar reason, the pitch d is desirably set within the range of $0.75L \leq d \leq 1.3L$. In particular, when d=0.87L, i.e., when an equilateral triangle can be formed by connecting two opening windows 30 adjacent to each other in the <10-10> direction and one opening window 30 located in the <1-210> direction from these two opening windows 30 and closest to the two opening windows 30, the crystal grains are arranged over the whole surface without interstices, so that the number of pits occurring in the epitaxial layer 34 becomes the smallest, whereby the defect density and internal stress of the GaN single crystal substrate can be minimized.

Also, the distance by which each opening window 30 in each <10-10> window group 32 shifts in the <10-10> direction from each opening window 30 of its adjacent <10-10> window group 32 is not always needed to be exactly ½ L, and the internal stress can be lowered if this distance is on the order of ⅖ L to ⅗ L.

It is desirable that the mask layer 28 have a thickness within the range of about 0.05 μm to about 0.5 μm. It is because of the fact that cracks may occur during the growth of GaN if the mask layer 28 is thicker than the upper limit of this range, whereas the GaAs substrate is damaged by vapor during the growth of GaN if the mask layer 28 is thinner than the lower limit of the range.

Fourth Embodiment

The GaN single crystal substrate in accordance with the fourth embodiment and a method of making the same will now be explained with reference to the manufacturing step charts of FIGS. 11A to 11D. This embodiment is similar to the second embodiment except for the form of the mask layer.

Figure 11A:
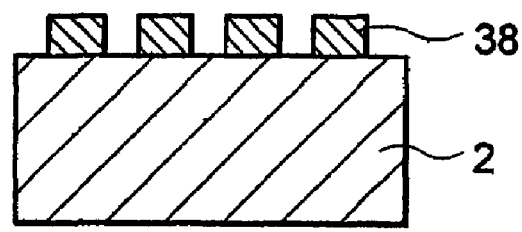
FIGS. 11A to 11D are views showing first to fourth steps of the method of making a GaN single crystal substrate in accordance with a fourth embodiment, respectively.

Initially, in the first step shown in FIG. 11A, a mask layer 38 made of SiN or $SiO_2$ is directly formed on the GaAs substrate 2. For forming the mask layer 38, an SiN film or $SiO_2$ film having a thickness of about 100 nm to about 500 nm is formed by plasma CVD or the like, and this SiN film or $SiO_2$ film is patterned by photolithography technique.

Figure 12:
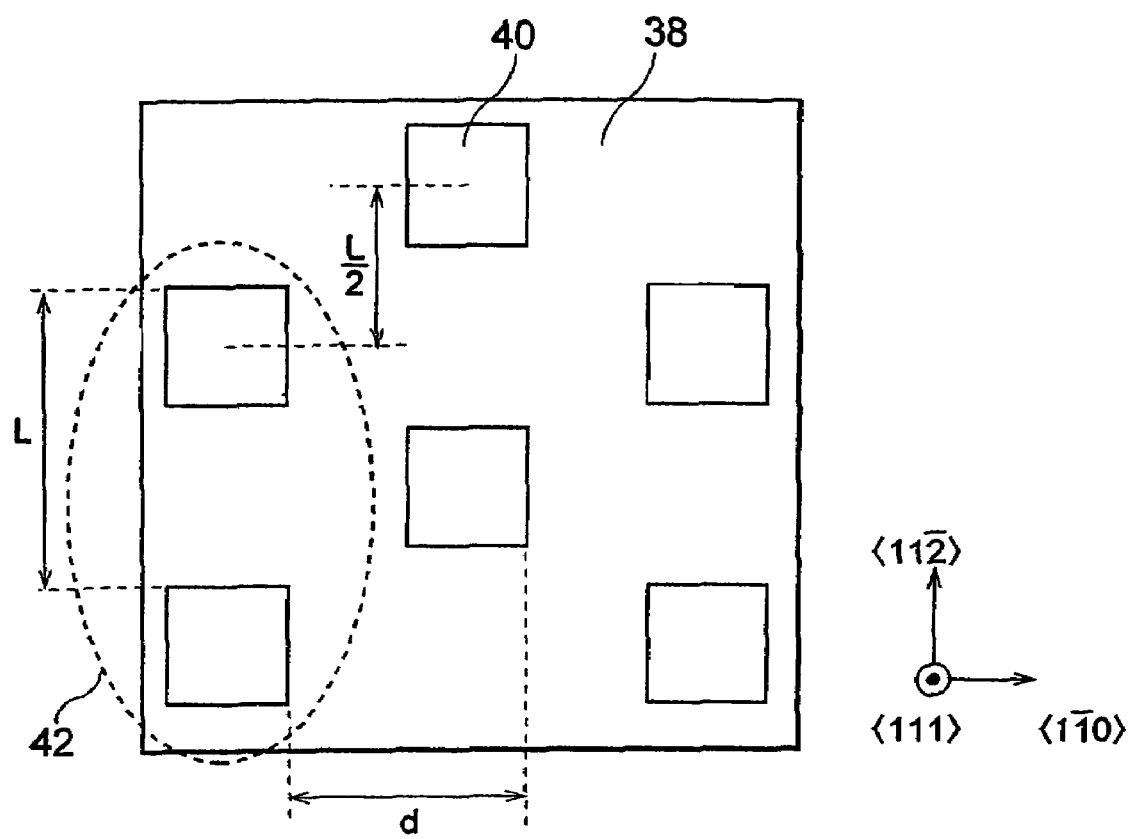
FIG. 12 is a plan view of a mask layer in the fourth embodiment.

FIG. 12 is a plan view of the wafer in the first step shown in FIG. 11A. As shown in FIG. 12, the mask layer 38 has a form similar to that of the mask layer 28 in the third embodiment. The mask layer 38 is formed with a plurality of opening windows 40. The opening windows 40 are arranged with a pitch L in the <11-2> direction of the GaAs substrate 2, so as to form a <11-2> window group 42. A plurality of <11-2> window groups 42 are arranged in parallel with a pitch d in the <1-10> direction of the GaAs substrate 2, while the center position of each opening window 40 in each <11-2> window group 42 shifts by ½ L in the <11-2> direction from the center position of each opening window 40 in the <11-2> window group 42 adjacent thereto. The mask layer 38 of this embodiment differs from the mask layer 28 of the third embodiment only in the arranging direction of each opening window as such.

Figure 11B:
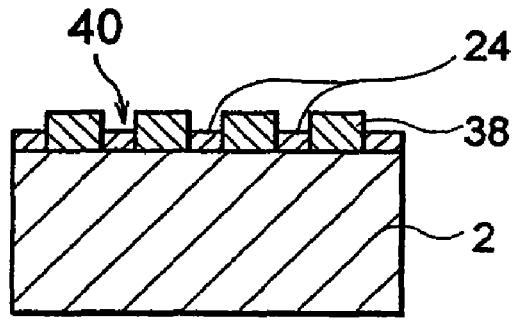

After the mask layer 38 is formed, a buffer layer 24 is formed on the GaAs substrate 2 within the opening windows 40 in the second step shown in FIG. 11B.

Figure 11C:
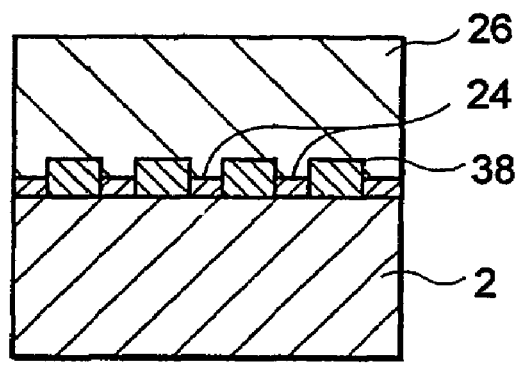

Subsequently, an epitaxial layer 26 made of GaN is grown on the buffer layer 24 in the third step shown in FIG. 11C.

As in the third embodiment, a GaN crystal grain in a truncated regular hexagonal pyramid grows from each opening window 40 in this embodiment. Subsequently, upon lateral growth of GaN crystal grains onto the mask layer 38, each GaN crystal grain connects with other GaN crystal grains without forming any interstices (pits) therebetween. Then, the individual GaN crystal grains cover the mask layer 38, whereby an epitaxial layer 26 having a mirror surface is formed.

Namely, since a plurality of <11-2> window groups 42 are arranged in parallel in the <1-10> direction of the GaAs substrate 2, while the center position of each opening window 40 shifts by ½ L in the <11-2> direction, the GaN crystal grains in truncated regular hexagonal pyramids grow without substantially generating interstices, whereby the true internal stress is greatly lowered.

It is not always necessary for the individual opening windows 40 to align with the <11-2> direction of the GaAs substrate 2. For example, they may be formed so as to align with the <1-10> direction of the GaAs substrate 2.

Figure 11D:
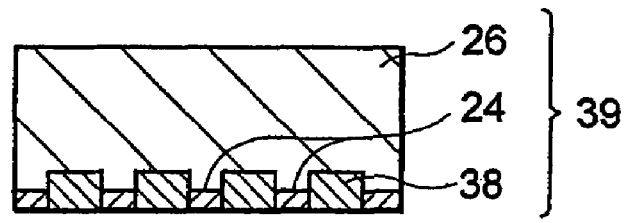

After the epitaxial layer 26 is grown, the fourth step shown in FIG. 11D is taken, so as to eliminate the GaAs substrate 2, whereby a GaN single crystal substrate 39 of this embodiment is accomplished. When the front surface or rear surface of the GaN single crystal substrate 39 has a high degree of roughness, the front surface and rear surface may be ground.

As explained above, the method of making a GaN single crystal substrate in accordance this embodiment can make a GaN substrate with greatly reduced defects by growing an epitaxial layer only once, thereby being able to cut down the cost.

Fifth Embodiment

The GaN single crystal substrate in accordance with the fifth embodiment and a method of making the same will now be explained with reference to FIGS. 13A to 13E.

Figure 13A:
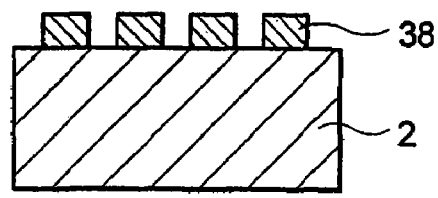
FIGS. 13A to 13E are views showing first to fifth steps of the method of making a GaN single crystal substrate in accordance with a fifth embodiment, respectively.

Initially, in the first step shown in FIG. 13A, a mask layer 38 preferably having a thickness of about 100 nm to about 500 nm is formed on a GaAs substrate 2 as in the fourth embodiment.

Figure 13B:
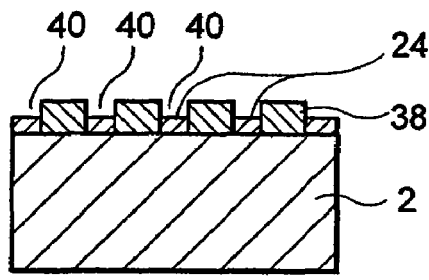

Subsequently, in the second step shown in FIG. 13B, a buffer layer 24 preferably having a thickness of about 500 nm to about 1200 nm is formed on the GaAs substrate 2 within opening windows 40.

Figure 13C:
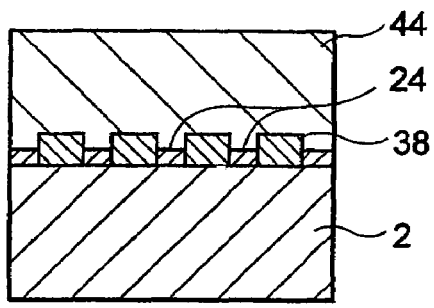

Then, in the third step shown in FIG. 13C, a first epitaxial layer 44 made of GaN is grown on the buffer layer 24 and the mask layer 38. Preferably, the thickness of the first epitaxial layer 44 is set within the range of about 50 μm to about 300 μm. In this embodiment, as in the third and fourth embodiments, the GaN crystal grain growing from each opening window 40 connects with other GaN crystal grains without forming interstices (pits) therebetween, thereby forming a structure in which the mask layer 38 is embedded.

Figure 13D:
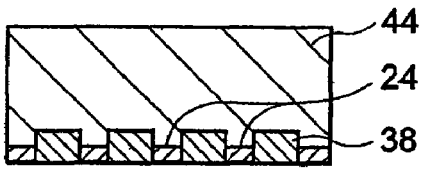

In the fourth step shown in FIG. 13D, the wafer formed with the first epitaxial layer 44 is disposed within an etching apparatus and is etched with aqua regia for about 10 hours, so as to completely eliminate the GaAs substrate 2. Thus, a thin GaN single crystal substrate having a thickness of about 50 μm to about 300 μm is temporarily formed.

Figure 13E:
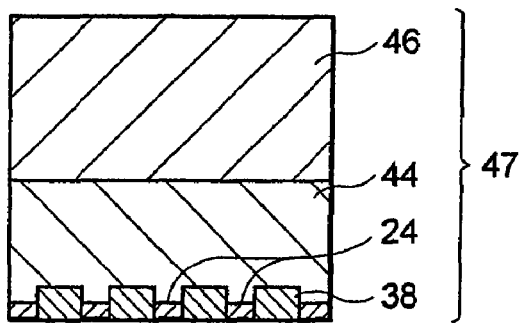

In the fifth step shown in FIG. 13E, a second epitaxial layer 46 made of GaN is grown with a thickness of about 100 μm to about 700 μm on the first epitaxial layer 44 by the above-mentioned HVPE method, organic metal chloride vapor phase growth method, MOCVD method, and the like. As a consequence, a GaN single crystal substrate 47 having a thickness of about 150 μm to about 1000 μm is formed.

In this embodiment, as mentioned above, the GaAs substrate 2 is eliminated before the second epitaxial layer 46 is grown, whereby thermal stress can be prevented from occurring due to differences in coefficient of thermal expansion between the GaAs substrate 2, buffer layer 34, and epitaxial layers 44, 46. Therefore, as compared with the case where epitaxial layers are completely grown without eliminating the GaAs substrate 2 on the way, a GaN single crystal substrate having a higher quality with less warpage and cracks can be produced.

The thickness of the epitaxial layer 44 is set to about 300 μm or less as mentioned above since influences of thermal stress become greater if the first epitaxial layer 44 is too thick. On the other hand, the thickness of the epitaxial layer 44 is set to about 50 μm or greater since the mechanical strength is weakened if the first epitaxial layer 44 is too thin, whereby handling becomes difficult.

Though a case employing the mask layer of the fourth embodiment as its mask layer is explained here, a mask layer having stripe windows such as that of the second embodiment may be used as well. If the front surface or rear surface of the GaN single crystal substrate 47 has a high degree of roughness, then the front surface and rear surface may be ground.

Sixth Embodiment

The GaN single crystal substrate in accordance with the sixth embodiment and a method of making the same will now be explained with reference to FIG. 14. The method of forming the buffer layer and epitaxial layer in this embodiment is the same as that in the third embodiment. The sixth embodiment differs from the third embodiment only in the form of opening windows in the mask layer.

Figure 14:
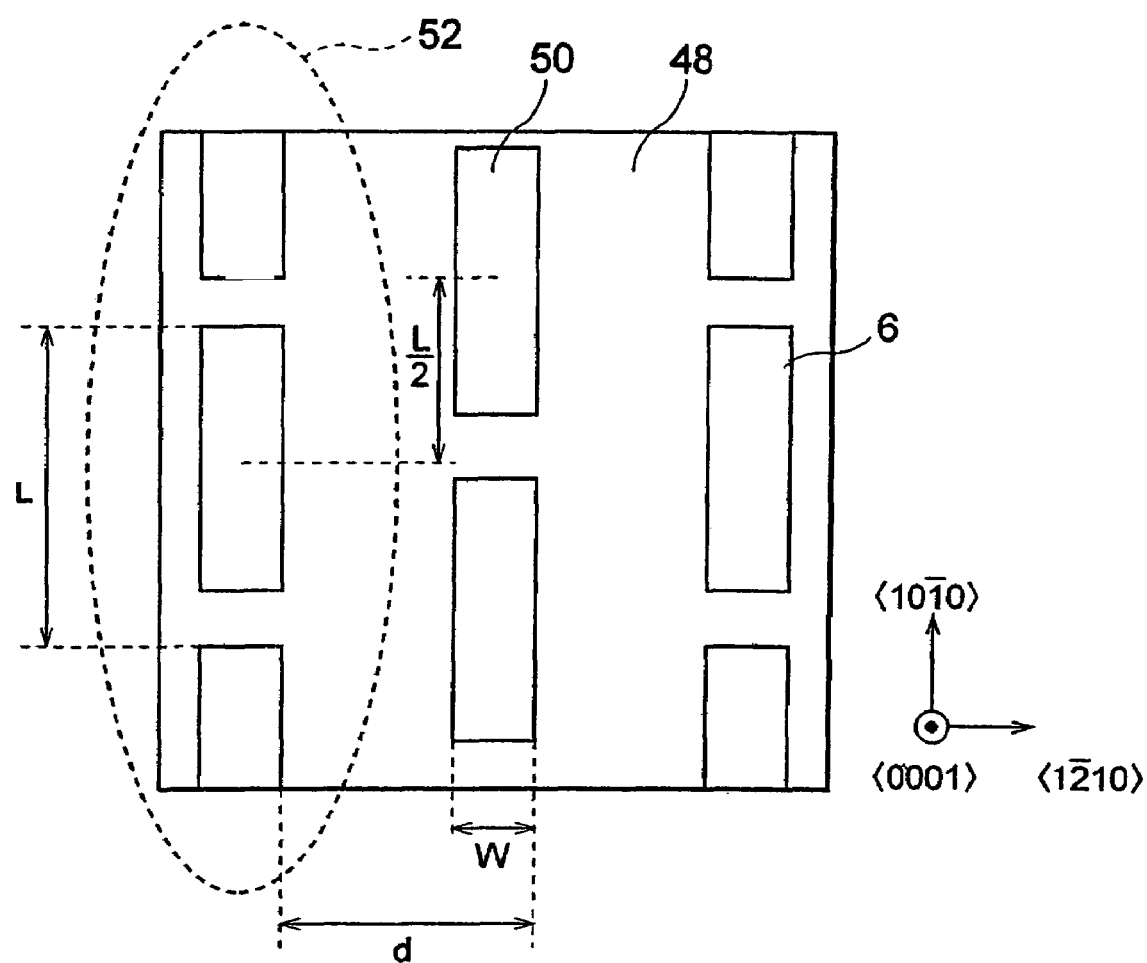
FIG. 14 is a plan view of a mask layer in a sixth embodiment.

FIG. 14 is a view showing the form and arrangement of individual opening windows in a mask layer 48 employed in this embodiment. As shown in this drawing, each opening window is formed like a rectangle (oblong form), yielding a rectangular window 50 whose longitudinal direction aligns with the <10-10> direction of a first epitaxial layer 6 which is the layer directly under the mask layer 48. Individual rectangular windows 50 are arranged with a pitch L in the <10-10> direction of the first epitaxial layer 6, so as to form a <10-10> rectangular window group 52. A plurality of <10-10> rectangular window groups 52 are arranged in parallel with a pitch d in the <1-210> direction of the first epitaxial layer 6, while the center position of each rectangular window 50 in each <10-10> rectangular window group 52 shifts by ½ L in the <10-10> direction from the center position of each rectangular window 50 in the <10-10> rectangular window group 52 adjacent thereto.

It is desirable that the pitch L be within the range of about 4 μm to about 20 μm in view of the fact that, when the rectangular window 50 is long in the longitudinal direction, the area where the second epitaxial layer does not grow laterally in the <10-10> direction becomes wider, whereby internal stress is harder to lower. The length of the mask between the rectangular windows 50 adjacent to each other in the longitudinal direction, i.e., <10-10> direction, is desirably about 1 μm to about 4 μm. It is because of the fact that GaN grows slowly in the <10-10> direction, whereby it takes longer time to form the second epitaxial layer if the mask length is too long.

It is desirable that the mask width (d−w) between the rectangular window groups 52 adjacent to each other in the <1-210> direction of the first epitaxial layer 6 be about 2 μm to about 10 μm. It is because of the fact that it takes longer time for crystal grains in a hexagonal prism form to become continuous with each other if the mask width (d−w) is too large, whereas the lateral growth may not be so effective that crystal defects are harder to lower if the mask width (d–w) is too small. Further, the width w of each rectangular window 50 is about 1 μm to about 5 μm. It is because of the fact that defects tend to occur more often in the GaN layer within each rectangular window 50 if the width w is too large, whereas each rectangular window 50 is harder to form if the width w is too narrow, whereby the growth rate of the second epitaxial layer tends to decrease.

After such a mask layer 48 is formed, a second epitaxial layer 12 made of GaN is grown on the mask layer 48 as in the third embodiment. A GaN crystal grain in a truncated regular hexagonal pyramid grows from each rectangular window 50 at the initial growing stage of the second epitaxial layer 12 in this embodiment as well. Subsequently, upon lateral growth of GaN crystal grains onto the mask layer 48, each GaN crystal grain connects with other GaN crystal grains without forming any interstices (pits) therebetween, thereby forming a structure in which the mask layer 48 is embedded.

Namely, since a plurality of <10-10> rectangular window groups 52 are arranged in parallel in the <1-210> direction of the first epitaxial layer 6, while the center position of each rectangular window 50 shifts by ½ L in the <10-10> direction of the first epitaxial layer 6, the GaN crystal grains in truncated regular hexagonal pyramids grow without generating pits, whereby crystal defects and true internal stress can be lowered.

Also, as in the third embodiment, dislocations hardly occur in the region of the second epitaxial layer above the mask portion of the mask layer 48 due to the effect of lateral growth of GaN crystal grains.

Further, since each rectangular window 50 is formed such that the longitudinal direction of each rectangular window 50 aligns with the <10-10> direction of the first epitaxial layer 6, the growth rate of the second epitaxial layer grown on the mask layer 48 can be enhanced. It is because of the fact that the {1-211} plane with a higher growth rate appears at the initial growing stage of GaN, so as to enhance the growth rate in the <1-210> direction, thereby shortening the time required for island-like GaN crystal grains formed within the individual rectangular windows 50 to become a continuous film.

The growth rate of the second epitaxial layer formed on the mask layer 48 can also be improved when the mask layer 48 is directly formed on the GaAs substrate 2 without the first epitaxial layer 6 interposed therebetween. In this case, it is preferred that the longitudinal direction of the rectangular window 50 be formed so as to align with the <11-2> direction of the GaAs substrate 2 under the mask layer 48.

Seventh Embodiment

The GaN single crystal substrate in accordance with the seventh embodiment and a method of making the same will now be explained with reference to FIG. 15. This embodiment is characterized in the form of windows in its mask layer. Its buffer layer and epitaxial layer are formed similar to those in each of the embodiments mentioned above.

Figure 15:
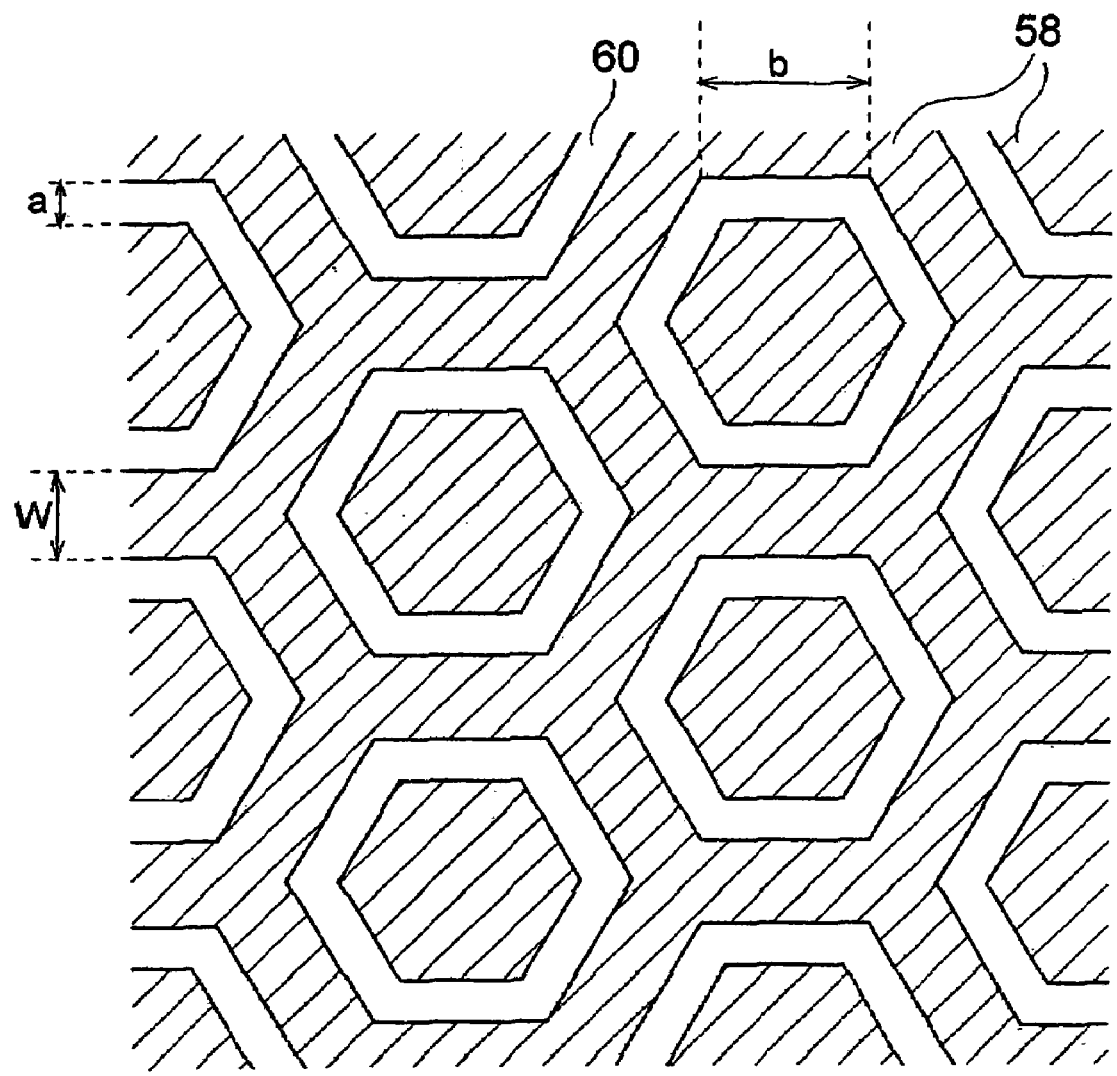
FIG. 15 is a plan view of a mask layer in a seventh embodiment.
Figure 15:
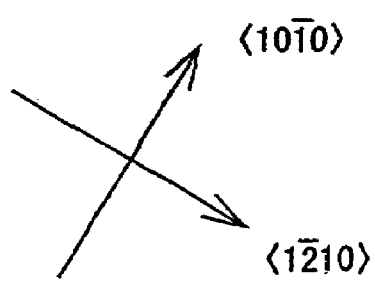

In this embodiment, as shown in FIG. 15, each opening window of the mask layer 58 is a hexagonal window 60 formed like a hexagonal ring. Each of the six sides of the hexagonal window 60 is formed so as to align with the <10-10> direction of the epitaxial layer under the mask layer 58. If each side of the hexagonal window 60 is formed in this direction, then the growth rate of the epitaxial layer formed on the mask layer 58 can be enhanced. It is because of the fact that the {1-211} surface with a higher growth rate grows in the <1-210> direction at the initial growing stage of GaN. Here, it is desirable that the window width a of the hexagonal window 60, the length b of one side of the outer regular hexagon, and the mask width w between adjacent hexagonal windows 60 be about 2 μm, about 5 μm, and about 3 μm, respectively. However, their values should not be restricted to this range. The arrows in FIG. 15 indicate crystal orientations of the epitaxial layer under the mask layer 58.

After the epitaxial layer is grown on the mask layer 58, the wafer is subjected to etching, so as to completely eliminate the GaAs substrate. Further, the surface from which the GaAs substrate has been eliminated is subjected to grinding, so as to form a GaN single crystal substrate in accordance with the present invention.

In the GaN single crystal substrate in accordance with the present invention, as in each of the embodiments mentioned above, dislocations hardly occur in the region of the epitaxial layer on the mask layer above the mask portion due to the effect of lateral growth of GaN crystal grains.

The growth rate of the epitaxial layer formed on the mask can also be improved when the mask layer 58 is directly formed on the GaAs substrate with no epitaxial layer interposed therebetween in a manner different from this embodiment. In this case, each of the six sides of the hexagonal window 42 is formed so as to align with the <11-2> direction of the GaAs substrate.

Eighth Embodiment

The GaN single crystal substrate in accordance with an eighth embodiment and a method of making the same will now be explained with reference to FIGS. 16A to 16F.

Figure 16A:
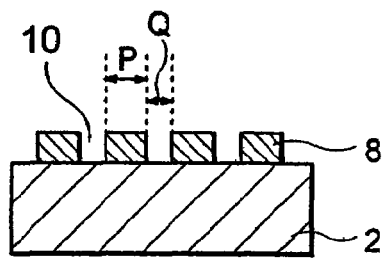
FIGS. 16A to 16F are views showing first to sixth steps of the method of making a GaN single crystal substrate in accordance with an eighth embodiment, respectively.
Figure 16B:
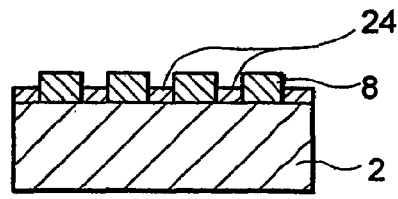
Figure 16C:
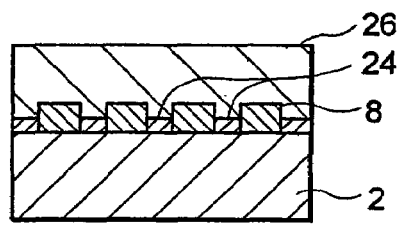
Figure 16D:
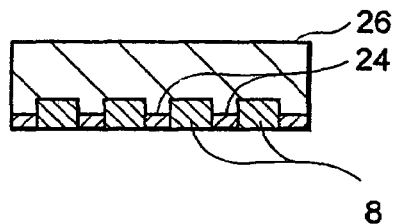

The forming of a mask layer 8 in the first step shown in FIG. 16A, the forming of a buffer layer 24 in the second step shown in FIG. 16B, the growth of an epitaxial layer 26 in the third step shown in FIG. 16C, and the elimination of a GaAs substrate 2 in the fourth step shown in FIG. 16D are carried out in a manner similar to those in the second embodiment, and will not be explained here. Here, the thickness of the GaN single crystal substrate from which the GaAs substrate 2 as been eliminated is desirably about 50 μm to about 300 μm as in the second embodiment, or greater.

Figure 16E:
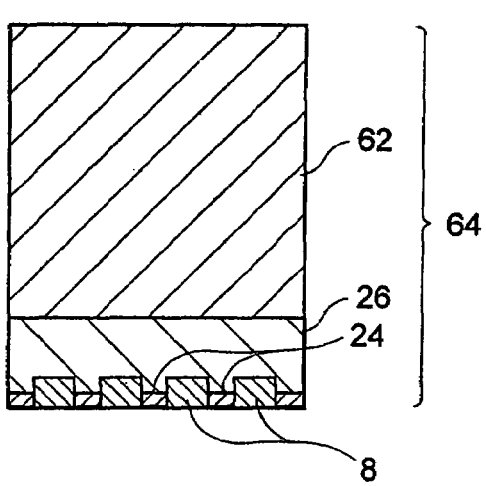
Figure 22:
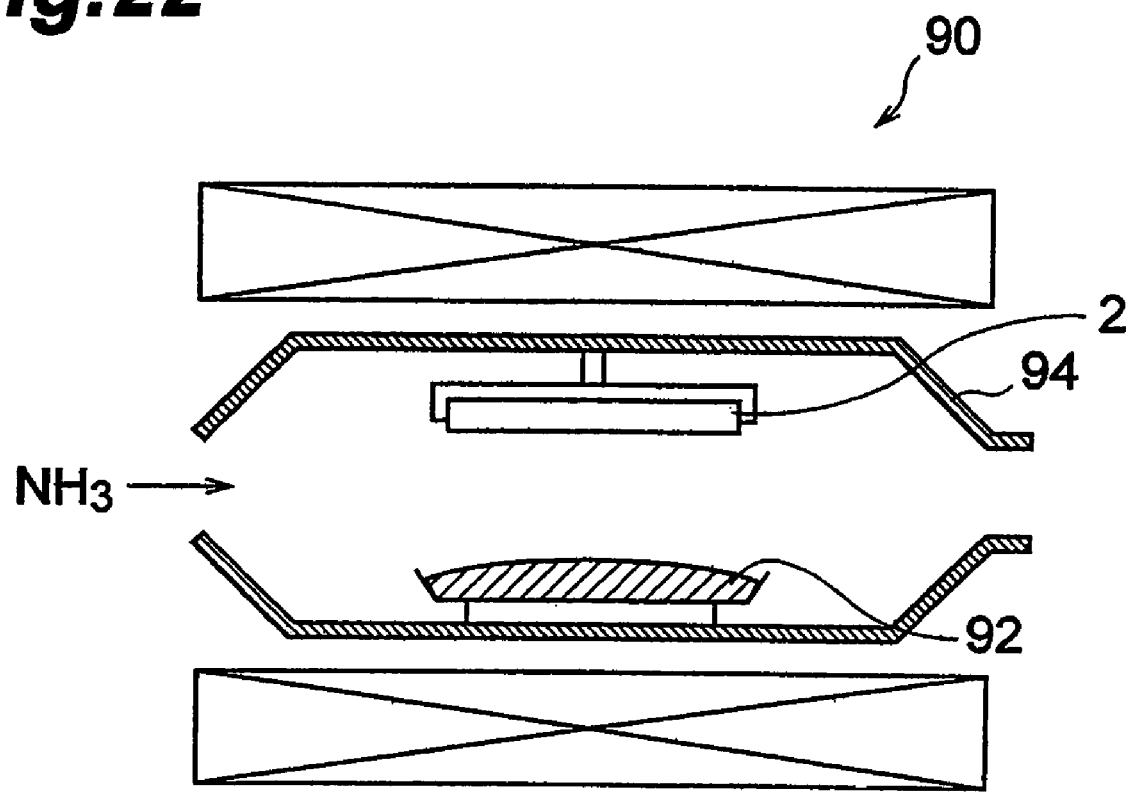
FIG. 22 is a view showing a vapor phase growth apparatus employed in sublimation method.

In the fifth step shown in FIG. 16E, while the GaN single crystal shown in FIG. 16D is used as a seed crystal, an epitaxial layer 62 made of GaN is grown on the epitaxial layer 26, so as to form an ingot 64 of GaN single crystal. While the method of growing the epitaxial layer 62 includes the HVPE method, organic metal chloride vapor phase growth method, MOCVD method, and the like as in each of the above-mentioned embodiments, sublimation method may also be employed in this embodiment. The sublimation method is a growth method carried by use of a growth apparatus 90 shown in FIG. 22. In particular, it is a vapor phase growth method in which an $NH_3$ gas and the like at a high temperature are caused to flow into a reactor 94 in which GaN powder 92, as a material, and a substrate 2 are installed so as to oppose each other, so that the $NH_3$ gas flows in while the GaN powder is diffusing upon evaporation, whereby GaN is grown on the substrate 2. Though minute control is difficult, the sublimation method is suitable for forming a thick epitaxial layer, i.e., for making an ingot. In this embodiment, the reactor is set to a temperature of about 1000° C. to about 1300° C., and ammonia is caused to flow in at about 10 sccm to about 100 sccm with a nitrogen gas acting as a carrier gas.

Figure 16F:

Subsequently, in the sixth step shown in FIG. 16F, the ingot 64 of GaN single crystal is divided into a plurality of GaN single crystal substrates 66. The method of dividing the ingot 64 of GaN single crystal into a plurality of GaN single crystal substrates 66 includes a method by which the ingot 64 is cut with a slicer having inner peripheral teeth or the like and a method by which the ingot 64 is cleaved along a cleavage surface of the GaN single crystal. Here, both of the cutting and cleaving processes may be employed.

In this embodiment, as explained above, the ingot of GaN single crystal is cut or cleaved into a plurality of sheets, whereby a plurality of GaN single crystal substrates having reduced crystal defects can be obtained by a simple operation. Namely, as compared with each of the above-mentioned embodiments, mass productivity can be improved.

Preferably, the height of the ingot 64 is about 1 cm or greater. It is because of the fact that no mass production effect may be attained if the ingot 64 is lower than 1 cm.

Though the manufacturing method of this embodiment forms the ingot 64 based on the GaN single crystal substrate obtained by way of the manufacturing steps of the second embodiment shown in FIGS. 6A to 6D, this method is not restrictive. The ingot 64 may also be formed on the basis of the GaN single crystal substrates obtained by way of the manufacturing steps of the first to seventh embodiments.

Experiments elucidated that the GaN single crystal substrate 66 of this embodiment was controllable, without any intentional doping, to yield an n-type carrier concentration within the range of $1\times10^{16}$ cm$^{-3}$ to $1\times10^{20}$ cm$^{-3}$, an electron mobility within the range of 60 cm$^2$ to 800 cm$^2$, and a resistivity within the range of $1\times10^{-4}$ Ωcm to $1\times10$ Ωcm.

Ninth Embodiment

The GaN single crystal substrate in accordance with a ninth embodiment and a method of making the same will now be explained with reference to FIGS. 17A to 17C.

Figure 17A:
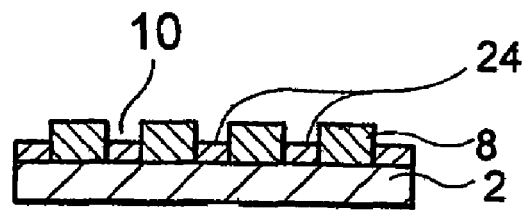
FIGS. 17A to 17C are views showing first to third steps of the method of making a GaN single crystal substrate in accordance with a ninth embodiment, respectively.

In the first step shown in FIG. 17A, a mask layer 8 and a buffer layer 24 are formed on a GaAs substrate 2. The methods of forming the mask layer 8 and buffer layer 24 are similar to those in each of the above-mentioned embodiments.

Subsequently, in the second step shown in FIG. 17B, an epitaxial layer 68 made of GaN is grown at once, so as to form an ingot 70. The method of growing the epitaxial layer 68 is similar to the method of growing the epitaxial layer 62 in the eighth embodiment. Here, the ingot 70 preferably has a height of about 1 cm.

Figure 17B:
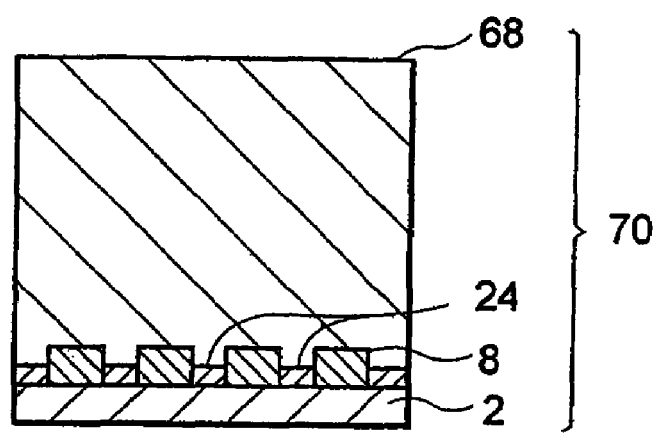
Figure 17C:
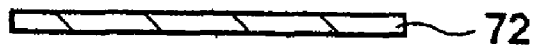

In the third step shown in FIG. 17C, as in the sixth step of the eighth embodiment, the ingot 70 of GaN single crystal is divided into a plurality of GaN single crystal substrates 70 by a cutting or cleaving process.

As mentioned above, since the ingot of GaN single crystal is cut or cleaved into a plurality of sheets, a plurality of GaN single crystal substrates having reduced crystal defects can be obtained by a simple operation in this embodiment. Namely, as compared with the first to seventh embodiments, mass productivity can be improved. Further, since the GaN epitaxial layer is grown only once, the manufacturing process can be made simpler and the cost can be cut down, as compared with the eighth embodiment.

Experiments elucidated that, as with the GaN single crystal substrate 66 of the eighth embodiment, the GaN single crystal substrate 72 of this embodiment was controllable, without any intentional doping, to yield an n-type carrier concentration within the range of $1\times10^{16}$ cm$^{-3}$ to $1\times10^{20}$ cm$^{-3}$, an electron mobility within the range of 60 cm$^2$ to 800 cm$^2$, and a resistivity within the range of $1\times10^{-4}$ Ωcm to $1\times10$ Ωcm.

Tenth Embodiment

The GaN single crystal substrate in accordance with a tenth embodiment and a method of making the same will now be explained with reference to FIGS. 18A and 18B.

Figure 18A:
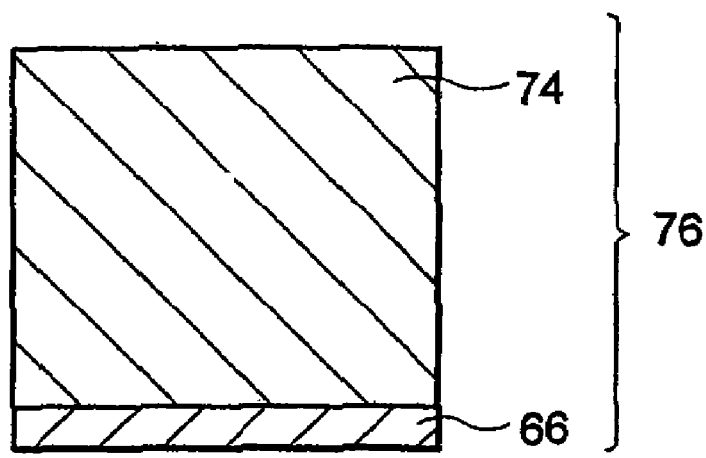
FIGS. 18A to 18B are views showing first and second steps of the method of making a GaN single crystal substrate in accordance with a tenth embodiment, respectively.
Figure 18B:
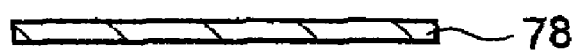

Initially, in the first step shown in FIG. 18A, an epitaxial layer 74 is grown on the GaN single crystal substrate 66 manufactured by the above-mentioned eighth embodiment, so as to form an ingot 76 of GaN single crystal. As the method of growing the epitaxial layer 74, the HVPE method, organic metal chloride vapor phase growth method, MOCVD method, sublimation method, and the like can be employed as in each of the above-mentioned embodiments.

Subsequently, in the second step shown in FIG. 18B, the ingot 76 of GaN single crystal is divided into a plurality of GaN single crystal substrates 78 by a cutting or cleaving process. As a consequence, the GaN single crystal substrate 78 of this embodiment can be obtained.

As mentioned above, since an ingot is produced on the basis of an already made GaN single crystal substrate, a plurality of GaN single crystal substrates having reduced crystal defects can be obtained by a simple operation in this embodiment. Though the ingot is produced while the GaN single crystal substrate 66 manufactured in the eighth embodiment is employed as a seed crystal in this embodiment, the seed crystal for the ingot is not restricted thereto. For example, the GaN single crystal substrate 72 of the ninth embodiment can be used as a seed crystal.

Eleventh Embodiment

The GaN single crystal substrate in accordance with an eleventh embodiment and a method of making the same will now be explained with reference to FIGS. 19A to 19C.

Figure 19A:
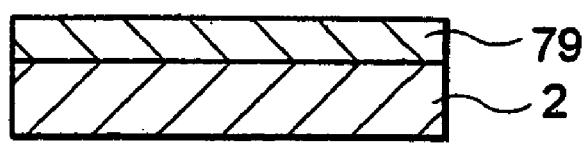
FIGS. 19A to 19C are views showing first to third steps of the method of making a GaN single crystal substrate in accordance with an eleventh embodiment, respectively.
Figure 19B:
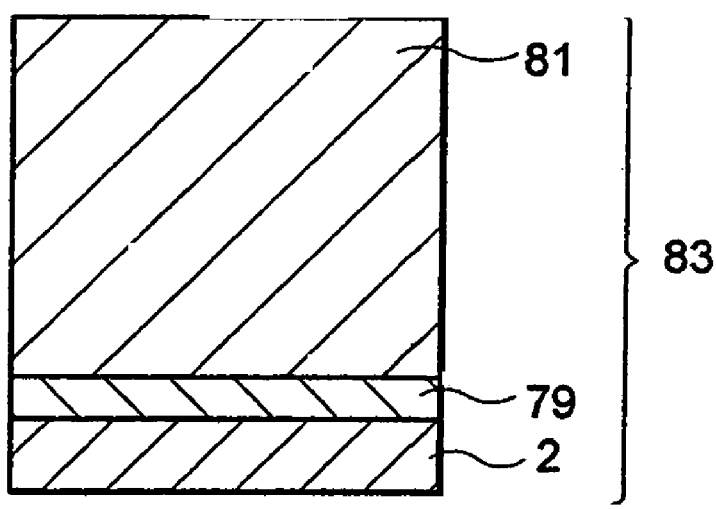

Initially, in the first step shown in FIG. 19A, a buffer layer 79 having a thickness of about 50 nm to about 120 nm is formed on a GaAs substrate 2.

Subsequently, in the second step shown in FIG. 19B, an epitaxial layer 81 made of GaN is grown on the buffer layer 79 without forming a mask layer, so as to form an ingot 83 of GaN single crystal having a height of 1 cm or greater. For growing the epitaxial layer 81, the HVPE method, organic metal chloride vapor phase growth method, MOCVD method, sublimation method, and the like can be employed. Since no mask layer is formed here, no lateral growth of the epitaxial layer occurs in this embodiment, whereby crystal defects are not small. However, dislocations can be reduced if the epitaxial layer is made thicker.

Figure 19C:
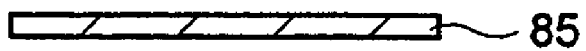

Finally, in the third step shown in FIG. 19C, the ingot 83 of GaN single crystal is divided into a plurality of GaN single crystal substrates 85 by a cutting or cleaving process.

As mentioned above, since the ingot of GaN single crystal substrate is cut or cleaved into a plurality of sheets, a plurality of GaN single crystal substrates having reduced crystal defects can be obtained by a simple operation in this embodiment. Namely, as compared with the first to seventh embodiments, mass productivity can be improved.

Light-Emitting Device and Electronic Device

Since the GaN single crystal substrate manufactured by each of the above-mentioned embodiments has a conductivity of n-type, a light-emitting device such as light-emitting diode or an electronic device such as field-effect transistor (MESFET) can be formed if a GaN type layer including an InGaN active layer is epitaxially grown thereon by the MOCVD method or the like. Since such a light-emitting device or the like is produced by use of a high-quality GaN substrate having less crystal defects manufactured by each of the above-mentioned embodiments, its characteristics are remarkably improved as compared with those of a light-emitting device using a sapphire substrate or the like. Also, since the (0001) plane of the epitaxial layer grown on the GaN single crystal substrate homo-epitaxially grows parallel to the (0001) plane of the GaN single crystal substrate, their cleavage surfaces coincide with each other, whereby the above-mentioned light-emitting device or the like has excellent performances.

Figure 20:
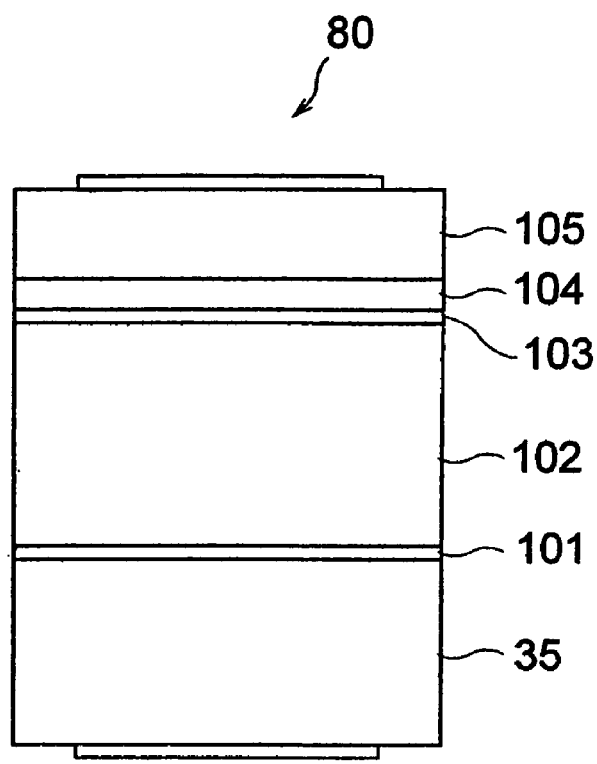
FIG. 20 is a view showing a light-emitting diode using the GaN single crystal substrate in accordance with the third embodiment.

FIG. 20 is a view showing a light-emitting diode 80 using the GaN single crystal substrate 35 obtained in the third embodiment. This light-emitting diode 80 has a quantum well structure in which a GaN buffer layer 101, an Si-doped n-type GaN barrier layer 102, an undoped $In_{0.45}Ga_{0.55}N$ well layer 103 having a thickness of 30 angstroms, an Mg-doped p-type $Al_{0.2}Ga_{0.8}N$ barrier layer 104, and an Mg-doped p-type GaN contact layer 105 are grown on the GaN single crystal substrate 35. Depending on the composition ratio of the undoped InGaN well layer 103, this light-emitting diode 80 can change its color of light emission. For example, it emits blue light when the composition ratio of In is 0.2.

Characteristics of the light-emitting diode 80 were studied and, as a result, it was found that the light-emitting luminance thereof was 2.5 cd, which was five times that of a conventional light-emitting diode using a sapphire substrate, 0.5 cd.

Without being restricted to the GaN single crystal substrate 35 of the third embodiment, the GaN single crystal substrates of other embodiments can also be used as the substrate for such a light-emitting diode as a matter of course.

Figure 21:
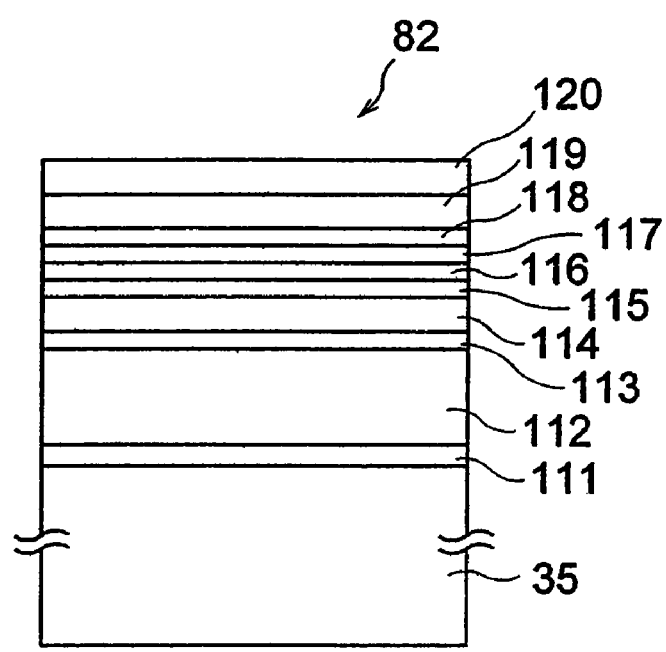
FIG. 21 is a view showing a semiconductor laser using the GaN single crystal substrate in accordance with the third embodiment.

FIG. 21 is a view showing a semiconductor laser 82 using the GaN single crystal substrate 35 obtained by the third embodiment. The semiconductor laser 82 has a structure in which a GaN buffer layer 111, an n-GaN contact layer 112, an n-$In_{0.05}Ga_{0.95}N$ cladding layer 113, an n-$Al_{0.08}Ga_{0.92}N$ cladding layer 114, an n-GaN guide layer 115, an MQW layer 116 made of multiple layers of Si-doped $In_{0.15}Ga_{0.85}N$ (35 angstroms)/Si-doped $In_{0.02}Ga_{0.08}N$ (70 angstroms), a p-$Al_{0.2}Ga_{0.8}N$ inner cladding layer 117, a p-GaN guide layer 118, a p-$Al_{0.08}Ga_{0.92}N$ cladding layer 119, and a p-GaN contact layer 120 are grown on the GaN single crystal substrate 35; whereas electrodes are taken from the upper and lower surfaces thereof.

This semiconductor laser exhibited an oscillation life exceeding 100 hours, which had conventionally been on the order of several minutes, thereby being able to realize a remarkable improvement in characteristics. Specifically, the oscillation life, which had conventionally been about 1.5 minutes, increased to about 120 hours.

Without being restricted to the GaN single crystal substrate 35 of the third embodiment, GaN single crystal substrates of other embodiments can also be employed in such a semiconductor laser as a matter of course.

Further, though not depicted, a field-effect transistor (MESFET) was produced on the basis of the GaN single crystal substrate in accordance with this embodiment. Characteristics of this field-effect transistor were studied and, as a result, a high mutual conductance (gm) of 43 mS/mm was obtained even at a high temperature of 500° C., whereby the GaN single crystal substrate of this embodiment was also found to be effective as a substrate for an electronic device.

EXAMPLE 1

Example 1, which is an example of the GaN single crystal substrate in accordance with the first embodiment and a method of making the same, will be explained with reference to FIGS. 1A to 1D.

As the GaAs substrate 2, a GaAs(111)A substrate, in which the GaAs (111) plane formed the Ga surface, was employed. Also, all of the buffer layer 4, the first epitaxial layer 6, and the second epitaxial layer 12 were formed according to the organic metal chloride vapor phase growth method by use of the vapor phase growth apparatus shown in FIG. 3.

Initially, in the first step shown in FIG. 1A, the buffer layer 4 was formed by the organic metal chloride vapor phase growth method. Here, while the GaAs substrate 2 was heated and held at a temperature of about 500° C. by the resistance heater 81, trimethyl gallium (TMG) at a partial pressure of $6\times10^{-4}$ atm, hydrogen chloride at a partial pressure of $6\times10^{-4}$ atm, and ammonia at a partial pressure of 0.13 atm were introduced into the reaction chamber 79. Then, the thickness of the buffer layer 4 was set to about 800 angstroms.

Subsequently, the first epitaxial layer 6 was grown on the buffer layer 4 by the organic metal chloride vapor phase growth method. Here, while the GaAs substrate 2 was heated and held at a temperature of about 970° C. by the resistance heater 81, trimethyl gallium (TMG) at a partial pressure of $2\times10^{-3}$ atm, hydrogen chloride at a partial pressure of $2\times10^{-3}$ atm, and ammonia at a partial pressure of 0.2 atm were introduced into the reaction chamber 79. Then, the thickness of the first epitaxial layer 6, was set to about 4 µm at a growth rate of about 15 µm/hr.

Thereafter, in the second step shown in FIG. 1B, the mask layer 8 made of $SiO_2$ was formed on the first epitaxial layer 6. Here, with the longitudinal direction of the stripe windows 10 being oriented to [10-10] of the first epitaxial layer 6, the thickness of the mask layer 8, the width P of the mask portion, and the window width Q were set to about 300 nm, about 5 µm, and about 2 µm, respectively.

Subsequently, in the third step shown in FIG. 1C, the second epitaxial layer 12 was grown by the organic metal chloride vapor phase growth method. Here, while the GaAs substrate 2 was heated and held at a temperature of about 970° C. by the resistance heater 81, trimethyl gallium (TMG) at a partial pressure of $2\times10^{-3}$ atm, hydrogen chloride at a partial pressure of $2\times10^{-3}$ atm, and ammonia at a partial pressure of 0.25 atm were introduced into the reaction chamber 79. Then, the thickness of the second epitaxial layer 12 was set to about 100 µm at a growth rate of about 20 µm/hr.

Figure 1D:
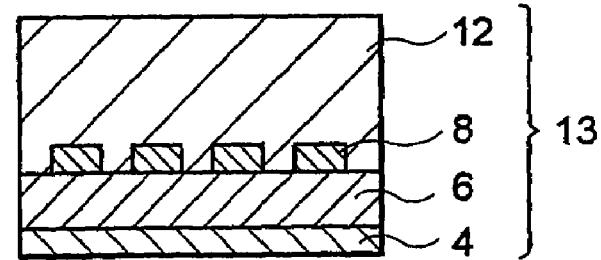

Thereafter, in the fourth step shown in FIG. 1D, the wafer was installed in an etching apparatus, and the GaAs substrate 2 was subjected to wet etching with an ammonia type etching liquid for about an hour, whereby the GaAs substrate 2 was completely eliminated. Then, finally, the surface from which the GaAs substrate 2 had been eliminated was subjected to grinding, whereby the GaN single crystal substrate 13 was accomplished.

Characteristics of the GaN single crystal substrate manufactured by this example were as follows. Namely, the substrate surface of the GaN single crystal substrate was the (0001) plane, its crystallinity was such that the X-ray half width by an X-ray analysis was 4.5 minutes, and the dislocation density was about $10^7$ ($cm^{-2}$) per unit area. As a consequence, it was seen that the crystal defects remarkably decreased as compared with a conventional case, in which a GaN epitaxial layer was formed on a sapphire substrate, yielding a defect density of $10^9$ (cm$^{-2}$) per unit area.

EXAMPLE 2

Example 2, which is another example of the first embodiment, will now be explained with reference to FIGS. 1A to 1D.

As the GaAs substrate 2, a GaAs(111)A substrate was employed. Also, all of the buffer layer 4, the first epitaxial layer 6, and the second epitaxial layer 12 were formed according to the HVPE method by use of the vapor phase growth apparatus shown in FIG. 2.

Initially, in the first step shown in FIG. 1A, the buffer layer 4 was formed by the HVPE method. Here, while the GaAs substrate 2 was heated and held at a temperature of about 500° C. by the resistance heater 61, hydrogen chloride at a partial pressure of $5\times10^{-3}$ atm, and ammonia at a partial pressure of 0.1 atm were introduced into the reaction chamber 59. Then, the thickness of the buffer layer 4 was set to about 800 angstroms.

Subsequently, the first epitaxial layer 6 was grown on the buffer layer 4 by the HVPE method. Here, while the GaAs substrate 2 was heated and held at a temperature of about 970° C. by the resistance heater 61, hydrogen chloride at a partial pressure of $2\times10^{-2}$ atm, and ammonia at a partial pressure of 0.25 atm were introduced into the reaction chamber 59. Then, the thickness of the first epitaxial layer 6 was set to about 4 μm at a growth rate of about 80 μm/hr.

Thereafter, in the second step shown in FIG. 1B, the mask layer 8 was formed on the first epitaxial layer 6. Here, with the longitudinal direction of the stripe windows 10 being oriented to [10-10] of the first epitaxial layer 6, the thickness of the mask layer 8, the width P of the mask portion, and the window width Q were set to about 300 nm, about 5 μm, and about 2 μm, respectively.

Subsequently, in the third step shown in FIG. 1C, the second epitaxial layer 12 was grown by the HVPE method. Here, while the GaAs substrate 2 was heated and held at a temperature of about 970° C. by the resistance heater 61, hydrogen chloride at a partial pressure of $2.5\times10^{-2}$ atm, and ammonia at a partial pressure of 0.25 atm were introduced into the reaction chamber 59. Then, the thickness of the second epitaxial layer 12 as set to about 100 μm at a growth rate of about 100 μm/hr. Since the HVPE method was thus used, it was possible for the growth rate of the epitaxial layer to become faster in this embodiment than in Example 1 in which the organic metal chloride vapor phase growth method was used.

Thereafter, in the fourth step shown in FIG. 1D, the wafer was installed in an etching apparatus, and the GaAs substrate 2 was subjected to wet etching with an ammonia type etching liquid for about an hour, whereby the GaAs substrate 2 was completely eliminated. Then, finally, the surface from which the GaAs substrate 2 had been eliminated was subjected to grinding, whereby the GaN single crystal substrate 13 was accomplished.

Characteristics of the GaN single crystal substrate manufactured by this example were as follows. Namely, the substrate surface of the GaN single crystal substrate was the (0001) plane, its crystallinity was such that the X-ray half width by an X-ray analysis was 4.5 minutes, and the dislocation density was about $5\times10^7$ (cm$^{-2}$) per unit area. As a consequence, it was seen that the crystal defects remarkably decreased as compared with a conventional case, in which a GaN epitaxial layer was formed on a sapphire substrate, yielding a defect density of $10^9$ (cm$^{-2}$) per unit area.

EXAMPLE 3

Example 3, which is an example of the second embodiment, will now be explained with reference to FIGS. 6A to 6D.

As the GaAs substrate 2, a GaAs(111)B substrate, in which the GaAs(111) plane formed the As surface, was employed. Also, both of the buffer layer 24 and the second epitaxial layer 26 were formed according to the organic metal chloride vapor phase growth method by use of the vapor phase growth apparatus shown in FIG. 3.

Initially, inter first step shown in FIG. 6A, the mask layer 8 was formed on the GaAs substrate 2. Here, with the longitudinal direction of the stripe windows 10 being oriented to [11-2] of the GaAs substrate 2, the thickness of the mask layer 8, the width P of the mask portion, and the window width Q were set to about 350 nm, about 4 μm, and about 2 μm, respectively.

Subsequently, in the second step shown in FIG. 6B, the buffer layer 24 was formed on the GaAs substrate 2 within the stripe windows 10 by the organic metal chloride vapor phase growth method. Here, while the GaAs substrate 2 was heated and held at a temperature of about 500° C. by the resistance heater 81, trimethyl gallium (TMG) at a partial pressure of $6\times10^{-4}$ atm, hydrogen chloride at a partial pressure of $6\times10^{-4}$ atm, and ammonia at a partial pressure of 0.1 atm were introduced into the reaction chamber 79. Then, the thickness of the buffer layer 24 was set to about 700 angstroms.

Subsequently, in the third step shown in FIG. 6C, the epitaxial layer 26 was grown on the buffer layer 24 by the organic metal chloride vapor phase growth method. Here, while the GaAs substrate 2 was heated and held at a temperature of about 820° C. by the resistance heater 81, trimethyl gallium (TMG) at a partial pressure of $3\times10^{-3}$ atm, hydrogen chloride at a partial pressure of $3\times10^{-3}$ atm, and ammonia at a partial pressure of 0.2 atm were introduced into the reaction chamber 79. Then, the thickness of the epitaxial layer 26 was set to about 100 μm at a growth rate of about 30 μm/hr.

Thereafter, in the fourth step shown in FIG. 6D, the wafer was installed in an etching apparatus, and the GaAs substrate 2 was subjected to wet etching with an ammonia type etching liquid for about an hour, whereby the GaAs substrate 2 was completely eliminated. Then, finally, the surface from which the GaAs substrate 2 had been eliminated was subjected to grinding, whereby the GaN single crystal substrate 27 was accomplished.

The GaN single crystal substrate made by this example yielded a dislocation density of about $2\times10^7$ (cm$^{-2}$) per unit area. Namely, it was seen that, though the dislocation density of the GaN single crystal substrate made by this example was greater than that in the GaN single crystal substrates of Examples 1 and 2, its crystal defects were greatly reduced as compared with a conventional case where a GaN epitaxial layer was formed on a sapphire substrate. Also, since the number of manufacturing steps was smaller than that in Examples 1 and 2, it was possible to cut down the cost in this example.

EXAMPLE 4

Example 4, which is an example of the third embodiment, will now be explained with reference to FIGS. 8A to 8D.

As the GaAs substrate 2, a GaAs(111)A substrate was employed. Also, all of the buffer layer 4, the first epitaxial layer 6, and the second epitaxial layer 34 were formed according to the organic metal chloride vapor phase growth method by use of the vapor phase growth apparatus shown in FIG. 3.

Initially, in the first step shown in FIG. 8A, the buffer layer 4 was formed by the organic metal chloride vapor phase growth method. Here, while the GaAs substrate 2 was heated and held at a temperature of about 500° C. by the resistance heater 81, trimethyl gallium (TMG) at a partial pressure of $6 \times 10^{-4}$ atm, hydrogen chloride at a partial pressure of $6 \times 10^{-4}$ atm, and ammonia at a partial pressure of 0.1 atm were introduced into the reaction chamber 79. Then, the thickness of the buffer layer 4 was set to about 700 angstroms.

Subsequently, the first epitaxial layer 6 was grown on the buffer layer 4 by the organic metal chloride vapor phase growth method. Here, while the GaAs substrate 2 was heated and held at a temperature of about 970° C. by the resistance heater 81, trimethyl gallium (TMG) at a partial pressure of $2 \times 10^{-3}$ atm, hydrogen chloride at a partial pressure of $2 \times 10^{-3}$ atm, and ammonia at a partial pressure of 0.2 atm were introduced into the reaction chamber 79. Then, the thickness of the first epitaxial layer 6 was set to about 2 μm at a growth rate of about 15 μm/hr.

Thereafter, in the second step shown in FIG. 8B, the mask layer 28 made of $SiO_2$ was formed on the first epitaxial layer 6. Here, the opening window 30 was formed as a square having a side length of 2 μm, whereas the pitches L and d of the <10-10> window groups 32 were set to 6 μm and 5 μm, respectively. Also, the <10-10> window groups 32 adjacent to each other were shifted from each other by 3 μm in the <10-10> direction.

Subsequently, in the third step shown in FIG. 8C, the second epitaxial layer 34 was grown by the organic metal chloride vapor phase growth method. Here, while the GaAs substrate 2 was heated and held at a temperature of about 1000° C. by the resistance heater 81, trimethyl gallium (TMG) at a partial pressure of $4 \times 10^{-3}$ atm, hydrogen chloride at a partial pressure of $4 \times 10^{-3}$ atm, and ammonia at a partial pressure of 0.2 atm were introduced into the reaction chamber 79. Then, the thickness of the second epitaxial layer 34 was set to about 100 μm at a growth rate of about 25 μm/hr.

Thereafter, in the fourth step shown in FIG. 8D, the wafer was installed in an etching apparatus, and the GaAs substrate 2 was subjected to wet etching with aqua regia for about 10 hours, whereby the GaAs substrate 2 was completely eliminated. Then, finally, the surface from which the GaAs substrate 2 had been eliminated was subjected to grinding, whereby the GaN single crystal substrate 35 was accomplished.

Characteristics of the GaN single crystal substrate made by this example were as follows. Namely, its defect density was about $3 \times 10^7$ ($cm^{-2}$) which was remarkably lower than that conventionally yielded. Also, no cracks were seen. While a GaN single crystal substrate separately manufactured without the mask layer forming step yielded a radius of curvature of about 65 mm, the GaN single crystal substrate of this example exhibited a radius of curvature of about 770 mm, thus being able to remarkably lower its warpage. Also, the internal stress, which had conventionally been 0.05 Gpa, was reduced to about 1/10, i.e., about 0.005 Gpa, in the GaN single crystal substrate of this example. Here, the internal stress of the GaN single crystal substrate was calculated by the above-mentioned Stoney's expression (expression (2)). Also, its electric characteristics were calculated upon Hall measurement as an n-type carrier density of $2 \times 10^{18}$ $cm^{-3}$ and a carrier mobility of 180 $cm^2/V \cdot S$.

EXAMPLE 5

Example 5, which is an example of the fifth embodiment, will now be explained with reference to FIGS. 13A to 13E.

As the GaAs substrate 2, a GaAs(111)A substrate was employed. Also, all of the buffer layer 24, the first epitaxial layer 44, and the second epitaxial layer 46 were formed according to the HVPE method by use of the vapor phase growth apparatus shown in FIG. 2.

Initially, in the first step shown in FIG. 13A, the mask layer 38 was formed on the GaAs substrate 2. Here, the opening window 40 was formed as a circle having a diameter of 2 μm, whereas the pitches L and d of the <11-2> window groups were set to 6 μm and 5.5 μm, respectively. Also, the <11-2> window groups adjacent to each other were shifted from each other by 3 μm in the <11-2> direction.

Subsequently, in the second step shown in FIG. 13B, the buffer layer 24 was formed on the GaAs substrate 2 within the opening windows 40 by the HVPE method. Here, while the GaAs substrate 2 was heated and held at a temperature of about 500° C. by the resistance heater 61, trimethyl gallium (TMG) at a partial pressure of $6 \times 10^{-4}$ atm, hydrogen chloride at a partial pressure of $6 \times 10^{-4}$ atm, and ammonia at a partial pressure of 0.1 atm were introduced into the reaction chamber 59. Then, the thickness of the buffer layer 24 was set to about 700 angstroms.

Thereafter, in the third step shown in FIG. 13C, the first epitaxial layer 44 was grown on the buffer layer 24 by the HVPE method. Here, while the GaAs substrate 2 was heated and held at a temperature of about 970° C. by the resistance heater 61, trimethyl gallium (TMG) at a partial pressure of $5 \times 10^{-3}$ atm, hydrogen chloride at a partial pressure of $5 \times 10^{-3}$ atm, and ammonia at a partial pressure of 0.25 atm were introduced into the reaction chamber 59. Then, the thickness of the first epitaxial layer 44 was set to about 50 μm at a growth rate of about 25 μm/hr.

Subsequently, in the fourth step shown in FIG. 13D, the wafer was installed in an etching apparatus, and the GaAs substrate 2 was subjected to wet etching with aqua regia for about 10 hours, whereby the GaAs substrate 2 was completely eliminated. Thus, a thin GaN single crystal substrate having a thickness of about 50 μm was temporarily formed.

Then, in the fifth step shown in FIG. 13E, the second epitaxial layer 46 made of GaN having a thickness of about 130 μm was grown on the first epitaxial layer 44 by HVPE at a growth temperature of 100° C. and a growth rate of about 100 μm/hr with a hydrogen chloride partial pressure of $2 \times 10^{-2}$ atm and an ammonia partial pressure of 0.2 atm. As a consequence, the GaN single crystal substrate 47 having a thickness of about 180 μm was formed.

As a result of measurement, thus formed GaN single crystal substrate of this example exhibited a remarkably reduced defect density of about $2 \times 10^7/cm^2$ in the substrate surface, and no cracks were seen. Also, it was possible for the GaN single crystal substrate to reduce its warpage as compared with that conventionally exhibited, and its internal stress was very small, i.e., 0.002 Gpa.

EXAMPLE 6

Example 6, which is an example of the eighth embodiment, will now be explained with reference to FIGS. 16A to 16F.

In this example, a GaAs(111)A substrate was employed as the GaAs substrate 2. Also, all of the buffer layer 24, the epitaxial layer 26, and the epitaxial layer 62 were formed according to the HVPE method by use of the vapor phase growth apparatus shown in FIG. 2.

Initially, in the first step shown in FIG. 16A, the mask layer 8 was formed on the GaAs substrate 2. Here, with the longitudinal direction of the stripe windows 10 being oriented to [11-2] of the GaAs substrate 2, the thickness of the mask layer 8, the width P of the mask portion, and the window width Q were set to about 300 nm, about 5 μm, and about 3 μm, respectively.

Subsequently, in the second step shown in FIG. 16B, the buffer layer 24 was formed on the GaAs substrate 2 within the stripe windows 10 by the HVPE method in the state where the temperature of the GaAs substrate 2 was set to about 500° C. Here, the thickness of the buffer layer 24 was set to about 800 angstroms.

Then, in the third step shown in FIG. 16C, the epitaxial layer 26 was grown by about 200 μm on the buffer layer 24 by the HVPE method in the state where the temperature of the GaAs substrate 2 was set to about 950° C.

Subsequently, in the fourth step shown in FIG. 16D, the GaAs substrate 2 was eliminated by etching with aqua regia.

In the fifth step shown in FIG. 16E, the epitaxial layer 62 was further thickly grown on the epitaxial layer 26 by the HVPE method in the state where the temperature within the reaction chamber 59 was set to 1020° C., whereby the ingot 64 of GaN single crystal was formed. The ingot 64 had a form in which the center part of its upper surface was slightly depressed, whereas its height from the bottom to the center part of the upper surface was about 2 cm, and its outside diameter was about 55 mm.

Subsequently, in the sixth step shown in FIG. 16F, the ingot 64 was cut with a slicer having inner peripheral teeth, whereby 20 sheets of the GaN single crystal substrates 66 each having an outside diameter of about 50 mm and a thickness of about 350 μm were obtained. No remarkable warpage was seen to occur in the GaN single crystal substrates 66. After the cutting, the GaN single crystal substrates 66 were subjected to lapping and finish grinding.

Though only one single crystal substrate can be obtained by one manufacturing process in the above-mentioned Examples 1 to 5, 20 substrates were obtained by one manufacturing process in this example. Also, the manufacturing cost was cut down to about 65% in practice. Thus, this example was able to cut down the cost greatly and further shorten the manufacturing time per sheet.

As a result of measurement of electric characteristics, the GaN single crystal substrate 66 obtained from the uppermost end portion of the ingot 64 exhibited an n-type carrier density of $2\times10^{18}$ cm$^{-3}$, an electron mobility of 200 cm$^2$/Vs, and a resistivity of 0.017 Ωcm.

As a result of measurement of electric characteristics, the GaN single crystal substrate 66 obtained from the lowermost end portion of the ingot 64 exhibited an n-type carrier density of $8\times10^{18}$ cm$^{-3}$, an electron mobility of 150 cm$^2$/Vs, and a resistivity of 0.006 Ωcm.

Hence, the intermediate portion of the ingot 64 can be qualitatively guaranteed to have characteristics with values between or near those mentioned above, whereby the labor of inspecting all the products can be saved.

When an LED having InGaN as a light-emitting layer was prepared by use of the GaN single crystal substrate 66, its light-emitting luminance was about five times as high as that of a conventional one formed on a sapphire substrate. The light-emitting luminance was assumed to be improved because of the fact that, while a large number of through dislocations exist within active layers in the conventional LED, no through dislocations exist within the light-emitting layer in this example.

EXAMPLE 7

Example 7, which is another example of the eighth embodiment, will now be explained with reference to FIGS. 16A to 16F.

In this example, a GaAs(111)A substrate was employed as the GaAs substrate 2. Also, all of the buffer layer 24, the epitaxial layer 26, and the epitaxial layer 62 were formed according to the organic metal chloride vapor phase growth method by use of the vapor phase growth apparatus shown in FIG. 3.

Initially, in the first step shown in FIG. 16A, the mask layer 8 was formed on the GaAs substrate 2. Here, with the longitudinal direction of the stripe windows 10 being oriented to [11-2] of the GaAs substrate 2, the thickness of the mask layer 8, the width P of the mask portion, and the window width Q were set to about 500 nm, about 5 μm, and about 3 μm, respectively.

Subsequently, in the second step shown in FIG. 16B, the buffer layer 24 was formed on the GaAs substrate 2 within the stripe windows 10 by the organic metal chloride vapor phase growth method in the state where the temperature of the GaAs substrate 2 was set to about 490° C. Here, the thickness of the buffer layer 24 was set to about 800 angstroms.

Then, in the third step shown in FIG. 16C, the epitaxial layer 26 was grown by about 25 μm on the buffer layer 24 by the organic metal chloride vapor phase growth method in the state where the temperature of the GaAs substrate 2 was set to about 970° C.

Subsequently, in the fourth step shown in FIG. 16D, the GaAs substrate 2 was eliminated by etching with aqua regia.

In the fifth step shown in FIG. 16E, the epitaxial layer 62 was further thickly grown on the epitaxial layer 26 by the organic metal chloride vapor phase growth method in the state where the temperature within the reaction chamber 79 was set to 1000° C., whereby the ingot 64 of GaN single crystal was formed. The ingot 64 had a form in which the center part of its upper surface was slightly depressed, whereas its height from the bottom to the center part of the upper surface was about 3 cm, and its outside diameter was about 30 mm.

Subsequently, in the sixth step shown in FIG. 16F, the ingot 64 was cut with a slicer having inner peripheral teeth, whereby 25 sheets of the GaN single crystal substrates 66 each having an outside diameter of about 20 mm to about 30 mm and a thickness of about 400 μm were obtained. No remarkable warpage was seen to occur in the GaN single crystal substrates 66. After the cutting, the GaN single crystal substrates 66 were subjected to lapping and finish grinding.

Though only one single crystal substrate can be obtained by one manufacturing process in the above-mentioned Examples 1 to 5, 25 substrates were obtained by one manufacturing process in this example. Also, the manufacturing cost was cut down to about 65% in practice. Thus, this example was able to cut down the cost greatly and further shorten the manufacturing time per sheet.

As a result of measurement of electric characteristics, the GaN single crystal substrate 66 obtained from the intermediate portion of the ingot 64 exhibited an n-type carrier density of $2\times10^{18}$ cm$^{-3}$, an electron mobility of 250 cm$^2$/Vs, and a resistivity of 0.015 Ωcm.

EXAMPLE 8

Example 8, which is an example of the ninth embodiment, will now be explained with reference to FIGS. 17A to 17C.

In this example, a GaAs(111)A substrate was employed as the GaAs substrate 2. Also, both of the buffer layer 24 and the epitaxial layer 68 were formed according to the HVPE method by use of the growth apparatus shown in FIG. 2.

Initially, in the first step shown in FIG. 17A, the mask layer 8 was formed on the GaAs substrate 2. Here, with the longitudinal direction of the stripe windows 10 being oriented to [11-2] of the GaAs substrate 2, the thickness of the mask layer 8, the width P of the mask portion, and the-window width Q were set to about 250 nm, about 5 μm, and about 3 μm, respectively. Then, after the mask layer 8 was formed, the buffer layer 24 was formed on the GaAs substrate 2 within the stripe windows 10 by the HVPE method in the state where the temperature of the GaAs substrate 2 was set to about 500° C. Here, the thickness of the buffer layer 24 was set to about 900 angstroms.

In the second step shown in FIG. 17B, the epitaxial layer 68 was grown on the buffer layer 24 by the HVPE method in the state where the temperature of the GaAs substrate 2 was set to about 1000° C., whereby the ingot 70 of GaN single crystal was formed. The ingot 70 had a form in which the center part of its upper surface was slightly depressed, whereas its height from the bottom to the center part of the upper surface was about 1.6 cm.

Subsequently, in the third step shown in FIG. 17C, the ingot 70 was cut with a slicer having inner peripheral teeth, whereby 12 sheets of the GaN single crystal substrates 72 each having a thickness of about 300 μm were obtained. No remarkable warpage was seen to occur in the GaN single crystal substrates 72. After the cutting, the GaN single crystal substrates 72 were subjected to lapping and finish grinding.

Though only one single crystal substrate can be obtained by one manufacturing process in the above-mentioned Examples 1 to 5, 12 substrates were obtained by one manufacturing process in this example. Also, the manufacturing cost was cut down to about 60% of that in Example 1. Thus, this example was able to cut down the cost greatly and further shorten the manufacturing time per sheet.

As a result of measurement of electric characteristics, the GaN single crystal substrate 72 obtained from the intermediate portion of the ingot 70 exhibited an n-type carrier density of $1\times10^{19}$ cm$^{-3}$, an electron mobility of 100 cm$^2$/VS, and a resistivity of 0.005 Ωcm.

EXAMPLE 9

Example 9, which is an example of the tenth embodiment, will now be explained with reference to FIGS. 18A and 18B.

Initially, in the first step shown in FIG. 18A, the epitaxial layer 74 was grown on the GaN single crystal substrate made by Example 6, whereby the ingot 76 of GaN single crystal was formed. Here, the epitaxial layer 74 was grown by the HVPE method in the state where the temperature of the GaAs substrate 2 was set to about 1010° C. The ingot 76 had a form in which the center part of its upper surface was slightly depressed, whereas its height from the bottom to the center part of the upper surface was about 2.5 cm, and its outside diameter was about 55 mm.

Subsequently, in the second step shown in FIG. 18B, the ingot 76 was cut with a slicer having inner peripheral teeth, whereby 15 sheets of the GaN single crystal substrates 78 each having an outside diameter of about 50 mm and a thickness of about 600 μm were obtained.

Though only one single crystal substrate can be obtained by one manufacturing process in the above-mentioned Examples 1 to 5, 15 substrates were obtained by one manufacturing process in this example. Also, the manufacturing cost was cut down to about 55% of that in the case manufactured in a process similar to Example 1. Thus, this example was able to cut down the cost greatly and further shorten the manufacturing time per sheet.

As a result of measurement of electric characteristics, the GaN single crystal substrate 78 obtained from the intermediate portion of the ingot 76 exhibited an n-type carrier density of $1\times10^{17}$ cm$^{-3}$, an electron mobility of 650 cm$^2$/Vs, and a resistivity of 0.08 Ωcm.

EXAMPLE 10

Example 10, which is another example of the tenth embodiment, will now be explained with reference to FIGS. 18A and 18B.

Initially, in the first step shown in FIG. 18A, the epitaxial layer 74 was grown on the GaN single crystal substrate made by Example 7, whereby the ingot 76 of GaN single crystal was formed. Here, the epitaxial layer 74 was grown according to the sublimation method by use of the growth apparatus shown in FIG. 22 in the state where the temperature of the GaAs substrate 2 was set to about 1200° C. Ammonia was caused to flow into the reaction vessel at 20 sccm. The ingot 76 was flatter than those of Examples 6 to 9, whereas its height from the bottom to the upper surface was about 0.9 cm, and its outside diameter was about 35 mm.

Subsequently, in the second step shown in FIG. 18B, the ingot 76 was cut with a slicer having inner peripheral teeth, whereby five sheets of the GaN single crystal substrates 78 each having an outside diameter of about 35 mm and a thickness of about 500 μm were obtained.

Though only one single crystal substrate can be obtained by one manufacturing process in the above-mentioned Examples 1 to 5, five substrates were obtained by one manufacturing process in this example. Also, the manufacturing cost was cut down to about 80% of that in Example 1. Thus, this example was able to cut down the cost greatly and further shorten the manufacturing time per sheet.

As a result of measurement of electric characteristics, the GaN single crystal substrate 78 obtained from the intermediate portion of the ingot 76 exhibited an n-type carrier density of $1\times10^{18}$ cm$^{-3}$, an electron mobility of 200 cm$^2$/Vs, and a resistivity of 0.03 Ωcm.

EXAMPLE 11

Example 11, which is an example of the eleventh embodiment, will now be explained with reference to FIGS. 19A to 19C.

Initially, in the first step shown in FIG. 19A, the buffer layer 79 made of GaN having a thickness of about 90 nm was formed by the HPVE method on the GaAs substrate 2 set to about 500° C. Here, a GaAs(111)B substrate was used as the GaAs substrate.

Subsequently, in the second step shown in FIG. 19B, the epitaxial layer 81 made of GaN was grown on the buffer layer 79 by the HVPE method, whereby the ingot 83 of GaN single crystal was formed. Here, the epitaxial layer 81 was grown by the HVPE method in the state where the temperature of the GaAs substrate 2 was set to about 1030° C. The ingot 83 had a form in which the center part of its upper surface was slightly depressed, whereas its height from the bottom to the center part of the upper surface was about 1.2 cm.

Finally, in the third step shown in FIG. 19C, the ingot 83 was cut with a slicer having inner peripheral teeth, whereby 10 sheets of the GaN single crystal substrates 85 each having a thickness of about 300 μm were obtained.

Though only one single crystal substrate can be obtained by one manufacturing process in the above-mentioned Examples 1 to 5, 10 substrates were obtained by one manufacturing process in this example. Also, the manufacturing cost was cut down to about 70% of that in Example 1. Thus, this example was able to cut down the cost greatly and further shorten the manufacturing time per sheet.

As a result of measurement of electric characteristics, the GaN single crystal substrate 85 obtained from the intermediate portion of the ingot 83 exhibited an n-type carrier density of $1\times10^{19}$ cm$^{-3}$, an electron mobility of 100 cm$^2$/Vs, and a resistivity of 0.005 Ωcm.

In the method of making a GaN single crystal substrate in accordance with the present invention, as explained in the foregoing, a GaN nucleus is formed within each opening window of a mask layer, and this GaN nucleus gradually laterally grows sideways above the mask layer, i.e., toward the upper side of the mask portion not formed with opening windows in the mask layer, in a free fashion without any obstacles. Therefore, the GaN single crystal substrate in accordance with the present invention having greatly reduced crystal defects can be obtained efficiently and securely by the method of making a GaN single crystal substrate in accordance with the present invention.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of making a GaN single crystal substrate comprising:
   a buffer layer forming step of forming a buffer layer on said GaAs substrate;
   a lower epitaxial layer growing step of growing on said buffer layer a lower epitaxial layer made of GaN;
   a mask layer forming step of forming on said lower epitaxial layer, a mask layer having a plurality of opening windows disposed separate from each other, the mask layer having a thickness in the range of 0.05 μm to 0.5 μm; and
   an epitaxial layer growing step of growing on said mask layer an upper epitaxial layer made of GaN,
   wherein said mask forming step includes arranging said plurality of said opening windows with a pitch L in a <10-10> direction of said lower epitaxial layer so as to form a <10-10> window group, and arranging a plurality of <10-10> window groups in parallel with a pitch d ($0.75L \leq d \leq 1.3L$) in a <1-210> direction of said lower epitaxial layer,
   wherein said upper expitaxial layer growing step includes initially growing a hexagonal pyramid shaped crystal in each of said opening windows whereafter each crystal connects with other crystals on said mask layer without interstices therebetween, and
   wherein said opening windows of said mask layer are rectangular windows in an oblong form having a longitudinal direction aligning with a <10-10> direction of said lower epitaxial layer, a plurality of said rectangular windows being arranged with a pitch L in said <10-10> direction so as to form a <10-10> rectangular window group, a plurality of <10-10> rectangular window groups being arranged in parallel with a pitch d in a <1-210> direction of said lower epitaxial layer.

2. A method of making a GaN single crystal substrate according to claim 1, further comprising after said epitaxial layer growing step:
   a GaAs substrate eliminating step of eliminating said GaAs substrate; and
   a grinding step of grinding a lower surface of said buffer layer and an upper surface of said epitaxial layer.

3. A method of making a GaN single crystal substrate according to claim 1, wherein said buffer layer is formed by hydride VPE.

4. A method of making a GaN single crystal substrate according to claim 1, wherein said <10-10> rectangular window groups are arranged in parallel such that the center position of each opening rectangular window in each <10-10> rectangular window group shifts by about ½ L in said <10-10> direction from the center position of each rectangular window in said <10-10> rectangular window group adjacent thereto.

5. A method of making a GaN single crystal substrate according to claim 1, wherein said rectangular windows have a pitch L of 4 μm to 20 μm, said rectangular windows adjacent to each other in the longitudinal direction of said rectangular windows have a mask length of 1 μm to 4 μm therebetween, each of said rectangular windows has a width w of 1 μm to 5 μm, and said rectangular windows adjacent to each other in the transverse direction of said rectangular windows have a mask width (d−w) of 2 μm to 10 μm therebetween.

6. A method of making a GaN single crystal substrate according to claim 1, wherein said epitaxial layer is grown in said epitaxial layer growing step so as to form an ingot of GaN single crystal,
   said method further comprising a cleaving step of cleaving said ingot into a plurality of sheets.

7. A method of making a GaN single crystal substrate according to claim 1, wherein said upper epitaxial layer is vapor phase grown on said mask layer.

8. A method of making a GaN single crystal substrate comprising:
   a buffer layer forming step of forming a buffer layer on said GaAs substrate;
   a lower epitaxial layer growing step of growing on said buffer layer a lower epitaxial layer made of GaN;
   a mask layer forming step of forming on said lower epitaxial layer, a mask layer having a plurality of opening windows disposed separate from each other, the mask layer having a thickness in the range of 0.05 μm to 0.5 μm; and
   an epitaxial layer growing step of growing on said mask layer an upper epitaxial layer made of GaN,
   wherein said mask forming step includes arranging said plurality of said opening windows with a pitch L in a <10-10> direction of said lower epitaxial layer so as to form a <10-10> window group, and arranging a plurality of <10-10> window groups in parallel with a pitch d ($0.75L \leq d \leq 1.3L$) in a <1-210> direction of said lower epitaxial layer,
   wherein said upper expitaxial layer growing step includes initially growing a hexagonal pyramid shaped crystal in each of said opening windows whereafter each crystal connects with other crystals on said mask layer without interstices therebetween, and
   wherein each of said opening windows of said mask layer is a hexagonal window formed like a hexagonal ring, each of the six sides of said hexagonal window aligning with a <10-10> direction of said lower epitaxial layer.

* * * * *